US012588214B2

(12) United States Patent
Hsiang et al.

(10) Patent No.: US 12,588,214 B2
(45) Date of Patent: Mar. 24, 2026

(54) INTEGRATED CIRCUIT DEVICE AND METHOD FOR FABRICATING THE SAME

(71) Applicants: TAIWAN SEMICONDUCTOR MANUFACTURING COMPANY, LTD., Hsinchu (TW); NATIONAL TAIWAN UNIVERSITY, Taipei (TW); National Taiwan Normal University, Taipei City (TW)

(72) Inventors: Kuo-Yu Hsiang, Kaohsiung City (TW); Chun-Yu Liao, Taipei City (TW); Jen-Ho Liu, Taipei City (TW); Min-Hung Lee, Taipei City (TW)

(73) Assignees: TAIWAN SEMICONDUCTOR MANUFACTURING COMPANY, LTD., Hsinchu (TW); NATIONAL TAIWAN UNIVERSITY, Taipei (TW); NATIONAL TAIWAN NORMAL UNIVERSITY, Taipei City (TW)

( * ) Notice: Subject to any disclaimer, the term of this patent is extended or adjusted under 35 U.S.C. 154(b) by 831 days.

(21) Appl. No.: 17/848,806

(22) Filed: Jun. 24, 2022

(65) Prior Publication Data

US 2023/0422515 A1    Dec. 28, 2023

(51) Int. Cl.
H10B 53/30      (2023.01)
H10D 1/68       (2025.01)

(52) U.S. Cl.
CPC .................................. H10B 53/30 (2023.02)

(58) Field of Classification Search
CPC .................................. H10B 53/30; H10D 1/68
See application file for complete search history.

(56) References Cited

U.S. PATENT DOCUMENTS

| 10,985,316 B2 * | 4/2021 | Chen | .................... H10N 70/826 |
| 2013/0043452 A1 * | 2/2013 | Meyer | .................. H10N 70/841 |
| | | | 257/E45.001 |

OTHER PUBLICATIONS

Fujii et al., "First demonstration and performance improvement of ferroelectric HfO$_2$-based resistive switch with low operation current and intrinsic diode property", 2016 Symposium on VLSI Technology Digest of Technical Papers, 2016.
Fujii et al., "Improved state stability of HfO$_2$ ferroelectric tunnel junction by template-induced crystallization and remote scavenging for efficient in-memory reinforcement learning", 2020 Symposium on VLSI Technology Digest of Technical Papers—TF2.3, 2020.
Goh et al., "Excellent Reliability and High-Speed Antiferroelectric HfZrO$_2$ Tunnel Junction by a High-Pressure Annealing Process and Built-In Bias Engineering", ACS Appl. Mater. Interfaces, 2020, vol. 12, pp. 57539-57546.

(Continued)

*Primary Examiner* — David Vu
(74) *Attorney, Agent, or Firm* — Birch, Stewart, Kolasch & Birch, LLP

(57) ABSTRACT

An integrated circuit device includes a substrate and a memory device. The memory device is over the substrate. The memory device includes a bottom electrode, a dielectric layer, an antiferroelectric layer, and a top electrode. The dielectric layer is over the bottom electrode. The antiferroelectric layer is over the dielectric layer. The top electrode is over the antiferroelectric layer.

20 Claims, 23 Drawing Sheets

(56)         References Cited

OTHER PUBLICATIONS

Huang et al., "A Comprehensive Modeling Framework for Ferroelectric Tunnel Junctions", 2019 IEEE International Electron Devices Meeting (IEDM), 2019, pp. 32.2.1 to 32.2.4.

Kobayashi et al., "Ferroelectric $HfO_2$ Tunnel Junction Memory With High TER and Multi-Level Operation Featuring Metal Replacement Process", IEEE Journal of the Electron Devices Society, 2019, vol. 7, pp. 134-139.

Lomenzo et al., "Depolarization as Driving Force in Antiferroelectric Hafnia and Ferroelectric Wake-Up", ACS Appl. Electron. Mater, 2020, vol. 2, pp. 1583-1595.

Max et al., "Direct Correlation of Ferroelectric Properties and Memory Characteristics in Ferroelectric Tunnel Junctions", Journal of the Electron Devices Society, 2019, vol. 7, pp. 1175-1181.

Max et al., "Retention Characteristics of $Hf_{0.5}Zr_{0.5}O_2$-based Ferroelectric Tunnel Junctions", 2019 IEEE 11th International Memory Workshop (IMW), 2019.

Pantel et al., "Electroresistance effects in ferroelectric tunnel barriers", Physical Review B, 2010, pp. 134105-1 to 134105-8.

Wu et al., "Sub-nA Low-Current HZO Ferroelectric Tunnel Junction for High-Performance and Accurate Deep Learning Acceleration", 2019 IEEE International Electron Devices Meeting (IEDM), 2019, pp. 6.3.1 to 6.3.4.

Zhuravlev et al., "Giant Electroresistance in Ferroelectric Tunnel Junctions", Physical Review Letters, 2005, pp. 246802-1 to 246802-4.

* cited by examiner

112

110

120

110

130

120

110

140

130

120

110

150
140
130
120
110

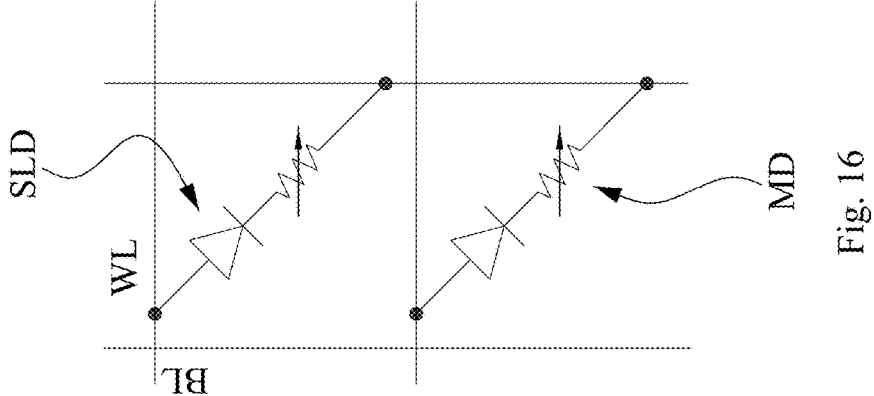
Fig. 16
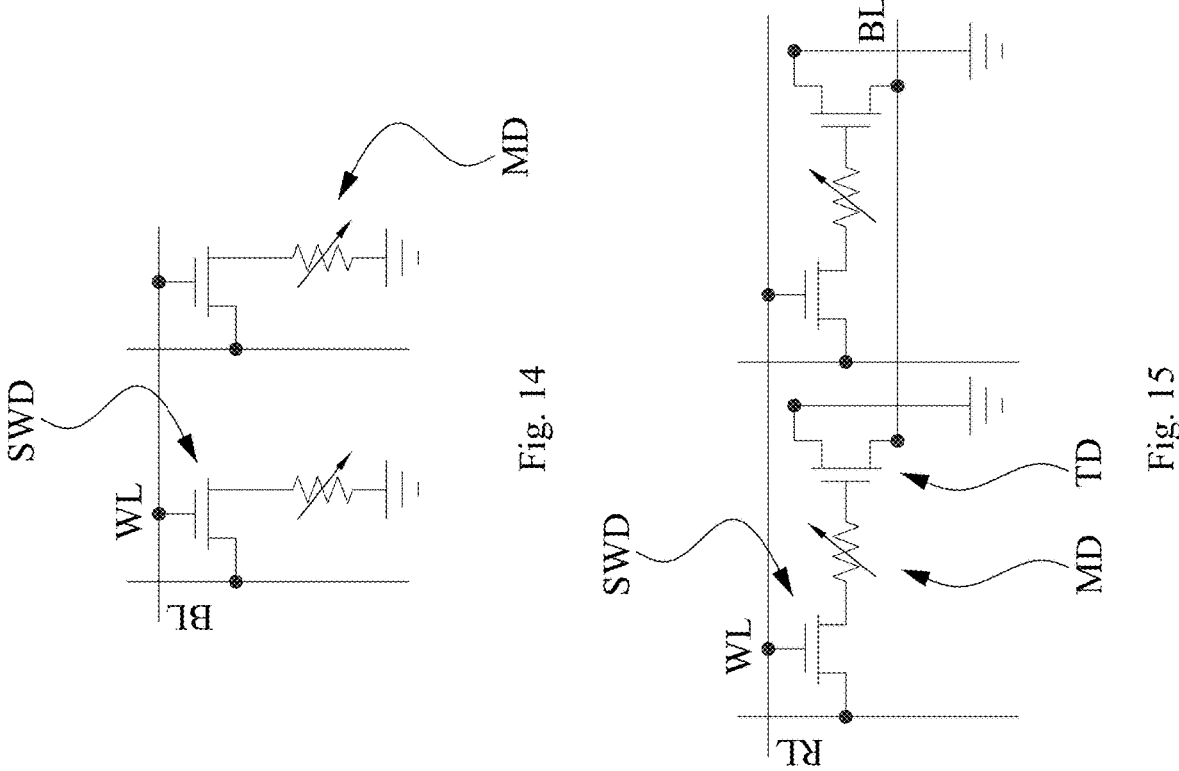
Fig. 14
Fig. 15

INTEGRATED CIRCUIT DEVICE AND METHOD FOR FABRICATING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 14-16 illustrate various circuit diagrams of integrated circuit devices having memory devices in accordance with some embodiments of the present disclosure.

DETAILED DESCRIPTION

Figure 1:
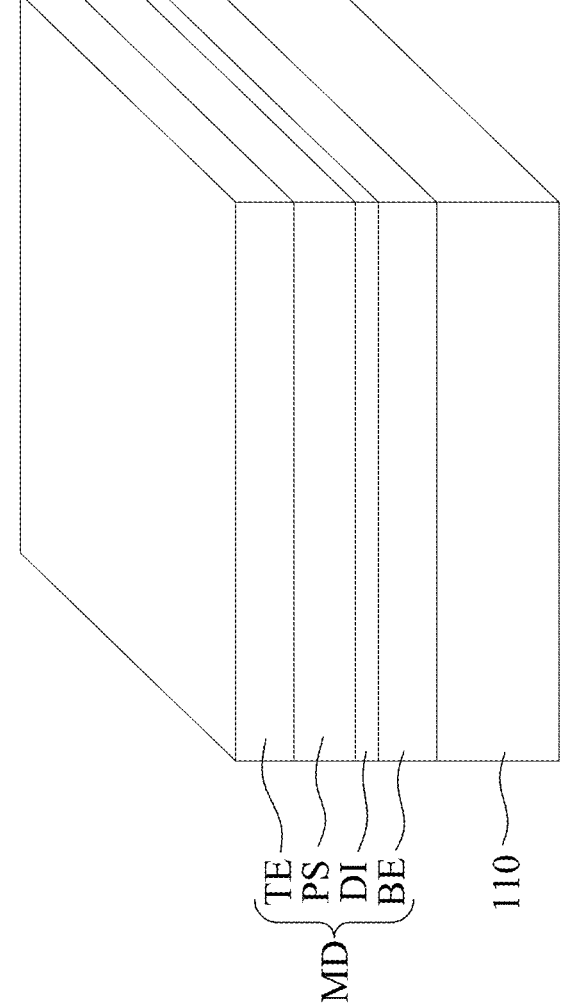
FIG. 1 is a perspective view of a memory device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" may mean within 20 percent, or within 10 percent, or within 5 percent of a given value or range. Numerical quantities given herein are approximate, meaning that the term "around," "about," "approximately," or "substantially" can be inferred if not expressly stated.

Antiferroelectric random access memory (AFERAM) is a nonvolatile memory, in which data are stored using hysteretic P-E (polarization vs. electric field) characteristics in an antiferroelectric film. Anti ferroelectric materials may indicate a crystal that consists of two sublattices which have anti-parallel dielectric polarizations each other, thus the net polarization of the crystal being almost zero. The material can be polarized in the direction of an electric field like a paraelectric material when placed in a weak electric field. When the electric field is increased, strong electric polarization is generated in the direction of the electric field like a ferroelectric material. It exhibits a double-hysteresis loop against changes of the electric field. Therefore, the antiferroelectric materials in the antiferroelectric film are electrically polarizable materials that possess at least two polarization states, which polarization states may be switched by the application of an external electric field. Each polarization state of antiferroelectric materials remains stable even after the removal of the applied electric field for at least some period of time. Due to this stability of polarization states, antiferroelectric materials have been used for memory applications. One of the polarization states is considered to be a logic "1" and the other state a logic "0." Antiferroelectric materials have a non-linear relationship between the applied electric field and the apparent stored charge, resulting in an antiferroelectric characteristic in the form of a double-hysteresis loop.

A memory device having an antiferroelectric (AFE) layer and the method of fabricating the same are provided in accordance with various exemplary embodiments. The intermediate stages of forming the memory device are illustrated. The variations of the embodiments are discussed. Throughout the various views and illustrative embodiments, like reference numbers are used to designate like elements.

FIG. 1 is a perspective view of a memory device MD according to some embodiments of the present disclosure. The memory device MD may include a bilayer tunneling junction over a substrate 110. For example, the bilayer tunneling junction of the memory device MD includes a bottom electrode BE, a dielectric layer DI, a polarization switching layer PS, and a top electrode TE stacked in a sequence over the substrate 110. In some embodiments of the present disclosure, the polarization switching layer PS of the memory device MD may be an antiferroelectric layer, and the memory device MD includes an antiferroelectric tunneling junction (AFTJ).

Figure 2B:
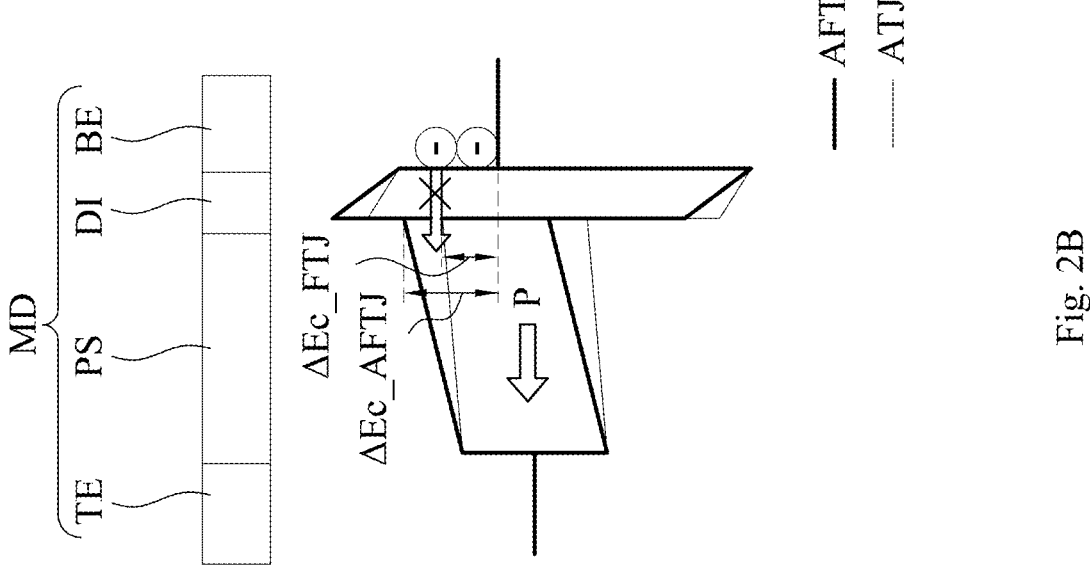
FIGS. 2A and 2B are energy band diagrams of a memory device with antiferroelectric tunneling junction (AFTJ) and a memory device with ferroelectric tunneling junction (FTJ) at on and off states according to some embodiments of the present disclosure.
Figure 2A:
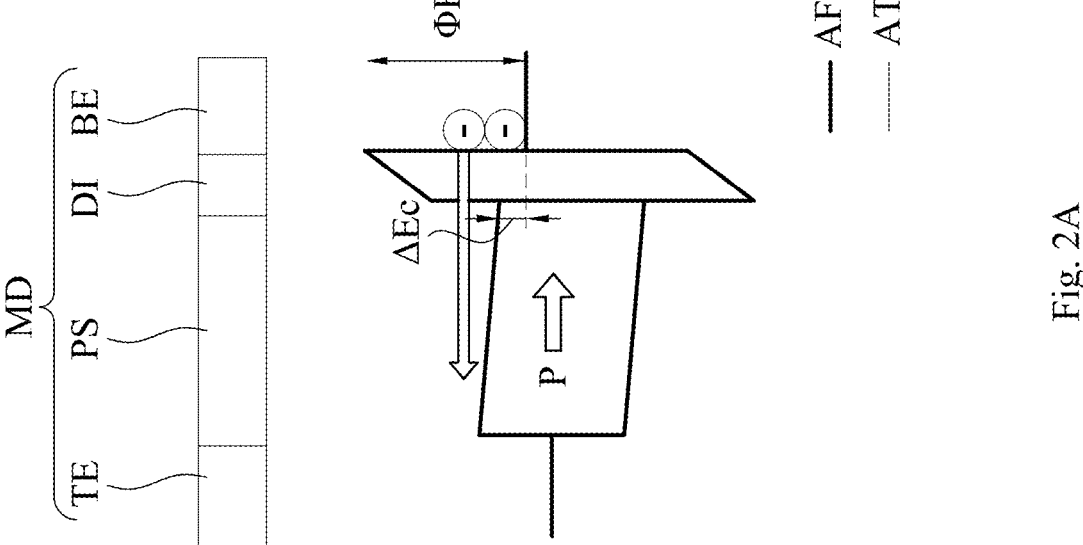

FIGS. 2A and 2B are energy band diagrams of bilayer tunneling junctions according to some embodiments of the present disclosure. In FIGS. 2A and 2B, the vertical axis of the band diagram represents the energy of an electron and the horizontal axis represents position. For the bilayer tunneling junction with the dielectric layer DI, by applying different voltages (e.g., positive and negative voltages) respectively on the electrodes, polarization switching of the polarization switching layer can be controlled. Polarization switching of the polarization switching layer PS may further affect the electric field direction of the dielectric layer DI. Therefore, by control the polarization switching of the polarization switching layer PS and the electric field direction of the dielectric layer DI, a low resistance state (ON state, FIG. 2A) and a high resistance state (OFF state, FIG. 2B) can be achieved. At the low resistance state (ON state, FIG. 2A), the tunneling barrier of the bilayer tunneling junction may depend on a thickness of the dielectric layer DE. At the high resistance state (OFF state, FIG. 2B), a tunneling barrier of the bilayer tunneling junction may depend on a thickness of the polarization switching layer PS and a thickness of the dielectric layer DE.

In FIGS. 2A and 2B, a bilayer AFTJ and a bilayer ferroelectric tunneling junction (FTJ) are shown. The bilayer FTJ may include a structure similar to the bilayer AFTJ as shown in FIG. 1, except that the polarization switching layer PS of the bilayer FTJ is a ferroelectric layer. A dielectric constant, which can be also called relative permittivity, indicates how easily a material can become polarized by imposition of an electric field on an insulator. In some embodiment, the polarization switching layer PS has a higher dielectric constant than that of the dielectric layer DE. The high dielectric constant of the polarization switching layer PS enhances voltage drop in the dielectric layer DE and suppresses off-state current tunneling. For example, the antiferroelectric layer may have a dielectric constant ranging from about 30 to about 35, the ferroelectric layer may have a dielectric constant ranging from about 25 to about 33, and the dielectric layer DE may have a dielectric constant ranging from about 8 to 10. The high dielectric constant of the antiferroelectric layer, greater than that of the ferroelectric layer, may further enhance voltage drop in the dielectric layer DE, such that bending the conduction band of the antiferroelectric layer is easier than bending the conduction band of the ferroelectric layer. In some embodiments, the dielectric layer DE has a dielectric constant greater than silicon oxide (~3.9) and less than the antiferroelectric layer. In some embodiments, the dielectric layer DE can be referred to as a high-k dielectric layer made of high-k dielectric materials. A density of electrons can be represented as follows:

At the ON state (FIG. 2A), the AFTJ and the FTJ are written with a positive voltage, such that the polarization switching layer PS is downward polarized, as indicated by the polarization direction P in FIG. 2A. The band diagram of the FTJ overlaps the band diagram of the AFTJ in FIG. 2A. The dielectric layer DE provides a potential barrier $\Phi_B$ between the polarization switching layer PS and the bottom electrode BE. At ON state, the AFTJ and the FTJ have similar conduction band offsets $\Delta E_c$ between the conduction bands of the polarization switching layer PS and the bottom electrode BE at opposite sides of the dielectric layer DE. And, at ON state, a thickness of the tunneling barrier ($d_{tun}$) is equal to a thickness of the dielectric layer DE. In some calculations, a current density may be represented as a function of $d_{tun}$. And, a electron density may be considered as proportional to $\exp(-q\Delta E_c/k_BT)$, in which $k_B$ is Boltzmann constant, T is temperature, and q is electron charge. As the AFTJ and the FTJ have similar conduction band offsets $\Delta E_c$ and same $d_{tun}$, the AFTJ and the FTJ may have similar on-state currents.

At the OFF state (FIG. 2B), the AFTJ and the FTJ are written with a negative voltage, such that the polarization switching layer PS is upward polarized, as indicated by the polarization direction P in FIG. 2B. At OFF state, a conduction band offset $\Delta E_{c\_AFTJ}$ of the AFTJ is greater than a conduction band offset $\Delta E_{c\_FTJ}$ of the FTJ. And, a thickness of the tunneling barrier ($d_{tun}$) is equal to a sum of a thickness of the dielectric layer DE and a thickness of the polarization switching layer PS. As the AFTJ has a greater conduction band offset than that of the FTJ, the AFTJ has an off-state current less than that of the FTJ. Thus, a tunneling electroresistance (TER) ratio of AFTJ is higher than that of the FTJ.

In some cases, for a single-layered tunneling junction (for example, omitting the dielectric layer DE), electrodes are used to create an asymmetric charge distribution on two sides of the polarization switching layer. By applying different voltages (e.g., positive and negative voltages) respectively on the electrodes, polarization switching of the polarization switching layer and screening charge density can be controlled, thereby achieving a high resistance state (OFF state) and a low resistance state (ON state). For the single-layered tunneling junction, at the high and low resistance states (OFF and ON states), a tunneling barrier of the single-layered tunneling junction may depend on a thickness of the polarization switching layer and asymmetric screening lengths ($\lambda_D$) of the electrodes. For the single-layered tunneling junction, the electrodes are designed with different conductive materials for their asymmetric screening lengths ($\lambda_D$).

Embodiments of the present disclosure are related to a bilayer antiferroelectric layer tunneling junction. Comparing the bilayer tunneling junction to the single-layered tunneling junction, since the on-state tunneling barrier of the bilayer tunneling junction is free of the influence of the thickness of the polarization switching layer PS, the polarization switching layer PS of the bilayer tunneling junction may be fabricated with a greater thickness than the polarization switching layer of the single-layered tunneling junction. In addition, since the tunneling barrier may be free of influence by materials of the electrode, the electrodes (e.g., the bottom and top electrode BE and TE) may include the same conductive material, such as TiN or TaN, or different conductive materials, such as TiN or TaN.

FIGS. 3-11 illustrate schematic cross-sectional views of a memory device at various stages of fabrication in accordance with some embodiments of the present disclosure. It is understood that additional operations may be provided before, during, and after the operations shown by FIGS. 3-11, and some of the operations described below can be replaced or eliminated for additional embodiments of the method. The order of the operations/processes may be interchangeable.

Figure 3:
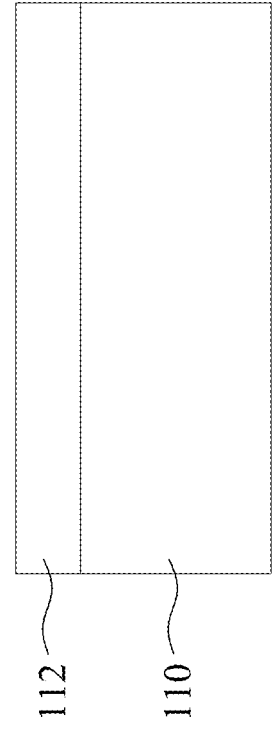
FIGS. 3-11 illustrate schematic cross-sectional views of a memory device at various stages of fabrication in accordance with some embodiments of the present disclosure.

Reference is made to FIG. 3. A substrate 110 is provided. The substrate 110 having transistors and one or more interconnect layers formed thereon. The substrate 110 may be a semiconductor substrate, such as silicon substrate. Alternatively, the substrate 110 may include another elementary semiconductor, such as germanium; a compound semiconductor including silicon carbide; an alloy semiconductor including silicon germanium; or combinations thereof. The substrate 110 may include group-IV semiconductor materials, III-V compound semiconductor materials, transition-metal dichalcogenides (TMD). In some embodiments, the substrate 110 is a semiconductor on insulator (SOI) substrate. The substrate 110 may include doped regions, such as p-wells and n-wells. The transistors are formed by suitable transistor fabrication processes and may be a planar transistor, such as polysilicon gate transistors or high-k metal gate transistors, or a multi-gate transistor, such as fin field effect transistors. After the transistors are formed, one or more interconnect layers of a multi-level interconnect (MLI) is formed over the transistors. As the substrate 110 is exposed to air under ambient conditions, a native oxide layer 112 is formed on the substrate 110. In some embodiments, when the substrate 110 comprises silicon, the native oxide layer 112 may be a thin layer of $SiO_2$.

Figure 4:
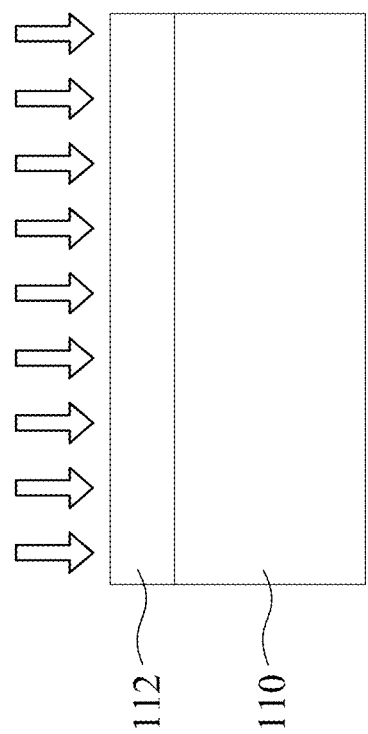

Reference is made to FIG. 4. The substrate 110 is subjected to a cleaning process for removing the native oxide layer 112 from the top surface of the substrate 110. The cleaning process may include using suitable cleaning agent, such as diluted wafer, HF, the like.

Figure 5:
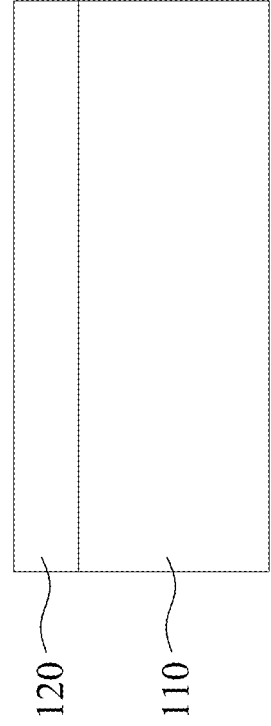

Reference is made to FIG. 5. A bottom electrode layer 120 is deposited over the substrate 110. In some embodiments, the bottom electrode layer 120 may include suitable conductive materials, such as TaN, TiN, W, Pt, Mo, Ta, Ti, metal silicide, the like, and/or the combination thereof. The bottom electrode layer 120 can be a single-layered structure or a multi-layered structure including plural stacked layers of metals and/or metal-containing compounds. The bottom electrode layer 120 may be exemplarily formed by CVD, PVD (e.g., sputtering deposition), ALD, the like, and/or the combination thereof. In some embodiments, a thickness of the bottom electrode layer 120 may be in a range from about 1 nanometer to about 1000 nanometers. In some other embodiments, the bottom electrode layer 120 may have other suitable thickness.

Figure 6:
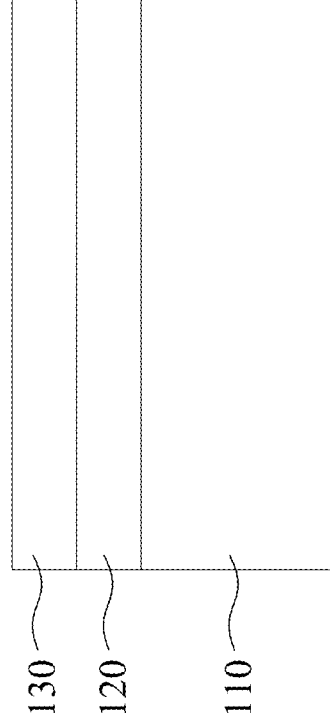

Reference is made to FIG. 6. A dielectric film 130 is deposited over the bottom electrode layer 120. The dielectric film 130 may include suitable dielectric materials, such as $SiO_2$, $Al_2O_3$, $HfO_2$, $ZrO_2$, the like, or the combination thereof. In some embodiments, the dielectric film 130 may be a high-k dielectric layer made of suitable high-k dielectric materials that have a dielectric constant greater than 3.9. In some embodiments, the dielectric film 130 has an electrical resistivity much greater than that of the bottom electrode layer 120. For example, the electrical resistivity of the dielectric film 130 is in a range from about $10^6$ $\Omega$cm to about $10^{20}$ $\Omega$cm. In the present embodiments, the dielectric film 130 may be formed by ALD. In some other embodiments, the dielectric film 130 may be formed by ALD, CVD, the like, and/or the combination thereof. In some embodiments, a thickness of the dielectric film 130 may be in a range from about 0.1 nanometer to about 10 nanometers. In some other embodiments, the dielectric film 130 may have other suitable thickness.

Figure 7:
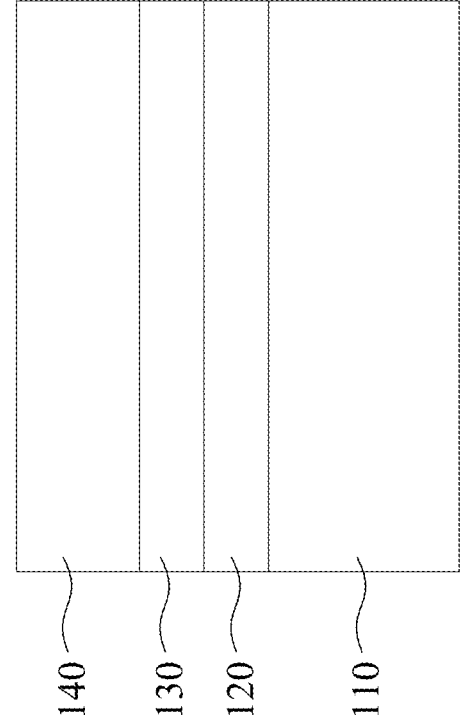

Reference is made to FIG. 7. An antiferroelectric film 140 is deposited over the dielectric film 130. In some embodiments, the antiferroelectric film 140 may include hafnium zirconium oxide (HZO), aluminum-doped hafnium oxide (HAO), silicon-doped hafnium oxide (HSO), lead zirconate titanate (PZT), strontium bismuth tantalite (SBT), the like, or the combination thereof. In some embodiments, the antiferroelectric film 140 may be high-k dielectric layer made of suitable high-k dielectric materials that have a dielectric constant greater than 3.9. In the embodiments where the antiferroelectric film 140 includes HZO, the antiferroelectric film 140 may include $Hf_xZr_{1-x}O_2$, in which x may be in a range from greater than 0% and less than 50% for antiferroelectric characteristics. Stated differently, a ratio of a Zr content to a sum of Zr content and Hf content in HZO is greater than 50% and less than 100%. For example, the antiferroelectric film 140 may include $Hf_{0.1}Zr_{0.9}O_2$ or $Hf_{0.25}Zr_{0.75}O_2$. Unlike the antiferroelectric layer, a ferroelectric layer may include $Hf_xZr_{1-x}O_2$, in which x may be in a range from greater than 50% and less than 100% for ferroelectric characteristics. The antiferroelectric film 140 may be formed by an ALD process or an PVD process. In some other embodiments, the antiferroelectric film 140 may include $Hf_xAl_{1-x}O_2$ or $Hf_xSi_{1-x}O_2$, in which x may be in a range from greater than 0% and less than 50% for antiferroelectric characteristics. Stated differently, a ratio of a Al/Si content to a sum of Al/Si content and Hf content in HAO/HSO is greater than 50% and less than 100%. For example, the antiferroelectric film 140 is deposited with a thickness in a range from about 1 nanometer to about 50 nanometers in some embodiments. In some further embodiments, the thickness of the antiferroelectric film 140 may be in a range from about 20 nanometers to about 50 nanometers in some embodiments.

Figure 12:
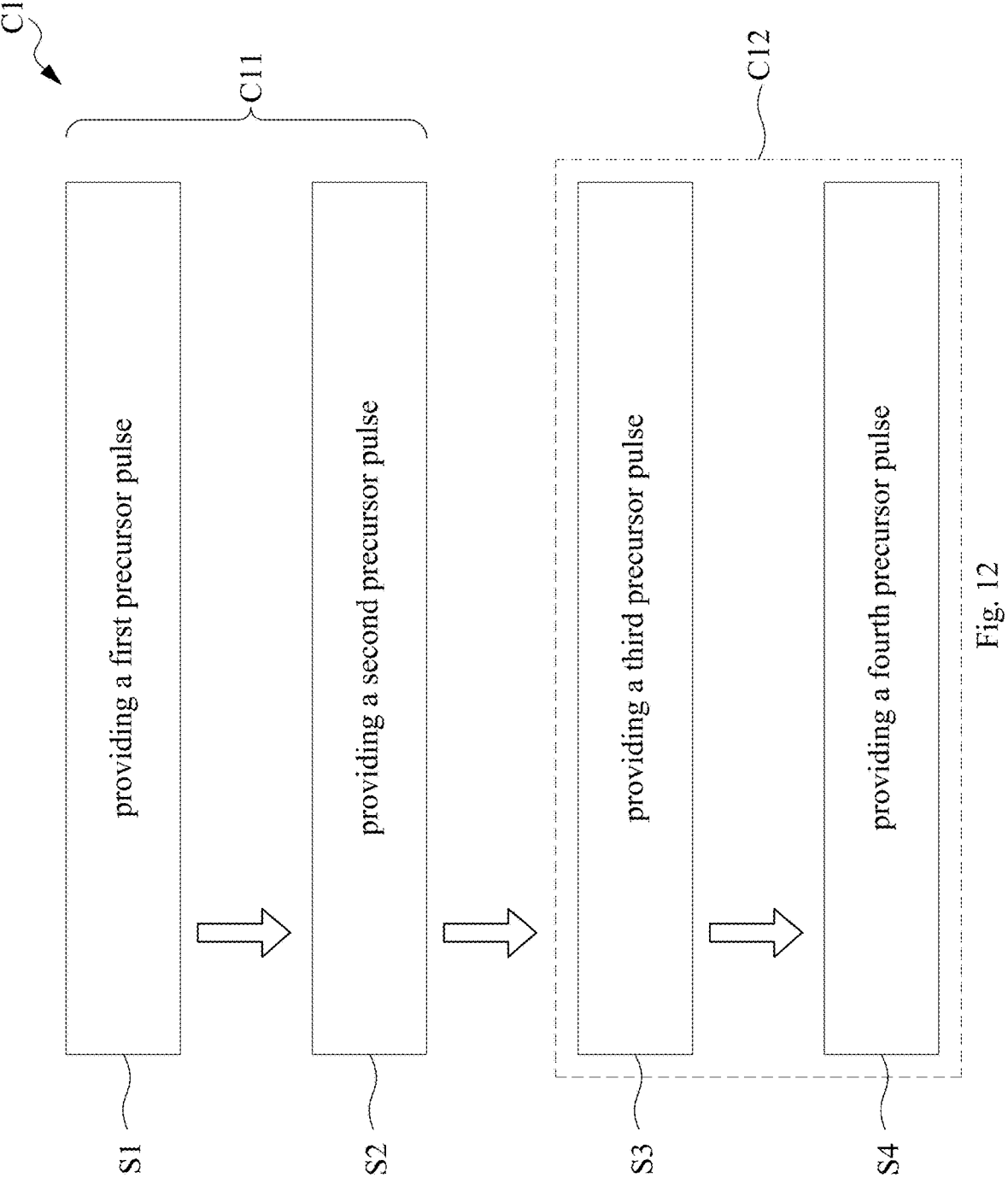
FIG. 12 is a flow chart of an exemplary atomic layer deposition process for an antiferroelectric layer in accordance with some embodiments of the present disclosure.

The ALD process is based on the sequential release of gaseous precursor (chemical reactants) pulses to deposit materials on the substrate layer by layer (thickness is about one or two atoms). For precisely controlling both the composition and thickness of the antiferroelectric film 140, the number of cycles of precursor purge and type of precursor are tuned. FIG. 12 is a flow chart of an exemplary ALD process for an antiferroelectric film 140 in accordance with some embodiments of the present disclosure. The ALD process may include plural cycles C1, each cycle C1 includes at least one first sub-cycle C11 and at least one second sub-cycle cycle C12. Each sub-cycle C11/C12 includes a first/third precursor pulse (denoted as the step S1/S3) and at least one second/fourth precursor pulse (denoted as the step S2/S4). At step S1, a first precursor is introduced into the process chamber producing a monolayer on the substrate surface. Afterwards, the chamber is purged with an inert carrier gas to remove unreacted precursor and reaction by-products. At step S2, a second precursor is pulsed into the chamber reacting with the first precursor to produce a monolayer of the desired film on the substrate surface. At step S3, a third precursor is introduced into the process chamber producing a monolayer on the substrate surface. Afterwards, the chamber is purged with an inert carrier gas to remove unreacted precursor and reaction by-products. At step S4, a fourth precursor is pulsed into the chamber reacting with the third precursor to produce a monolayer of the desired film on the substrate surface.

In some embodiments, for depositing HZO, the first and third precursor may be oxygen-containing precursor (e.g., $H_2O$), the first precursor may include tetrakis(dimethylamido)hafnium (TDMAHO, and the second precursor may include tetrakis(dimethylamino)zirconium (TDMAZr). The step S2 may be a hafnium-containing precursor pulse, and the sub-cycle C11 is associated with the formation of a hafnium-containing layer. The step S4 may be a zirconium-containing precursor pulse, and the sub-cycle C12 is associated with the formation of a zirconium containing layer. The number of sub-cycles C11 and C12 are tuned for precisely controlling the composition of the antiferroelectric film 140. For depositing the antiferroelectric $H_2O$ layer, a number of the at least one sub-cycle C12 (or the zirconium containing precursor pulse) is greater than a number of the at least one sub-cycle C11 (or the hafnium-containing precursor pulse). For example, for depositing $Hf_{0.1}Zr_{0.9}O_2$, in each cycle C1, the sub-cycle C11 may be performed one time, and the sub-cycle C12 be performed nine times. The cycle C1 may be repeated several times for precisely controlling a thickness of the antiferroelectric film 140. For example, the cycle C1 may be repeated 10 times for achieving about 5 nanometers to about 15 nanometers.

In some other embodiments, for depositing HAO, the second precursor may contain aluminum, and the step S2 may be an aluminum-containing precursor pulse associated with the formation of an aluminum containing layer. In some other embodiments, for depositing HSO, the second precursor may contain silicon, and the step S2 may be a silicon-containing precursor pulse associated with the formation of a silicon containing layer. When depositing HAO and HSO, a number of the at least first precursor pulse is also greater than a number of the at least one second precursor pulse for antiferroelectric characteristics.

In the ALD process for depositing the antiferroelectric film 140, a temperature of an ALD chamber may be in a range from about 150 Celsius degrees to about 350 Celsius degrees. In the ALD process for depositing the antiferroelectric film 140, at the step S1, the first precursor (e.g., TDMAHf) may be provided by a precursor pressure ranging from about 1 mtorr to about 60 mtorr; and step S2, the second precursor (e.g., TDMAZr) may be provided by a precursor pressure ranging from about 1 mtorr to about mtorr. At the steps P1 and P2, the oxygen-containing precursor (e.g., $H_2O$) may be provided by a precursor pressure ranging from about 1 mtorr to about 120 mtorr. If the temperature of the ALD chamber and the precursor pressures are out of the above ranges, monolayers may not be formed.

Figure 8:
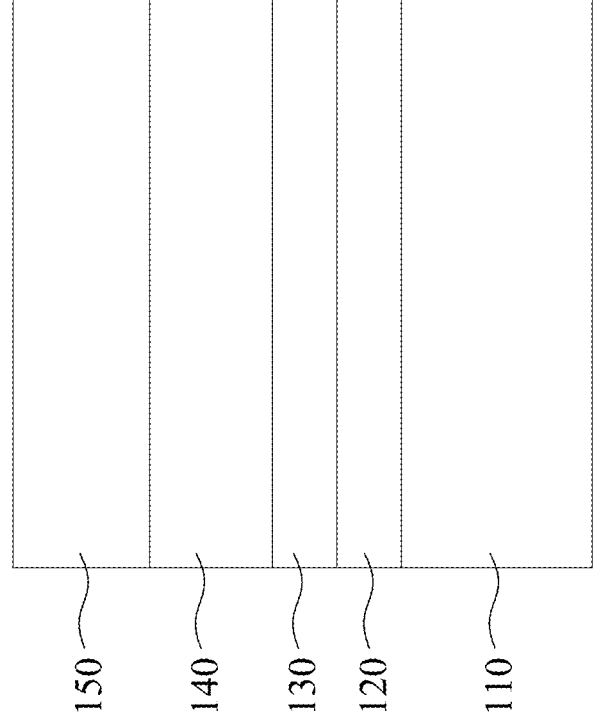

Reference is made to FIG. 8. A top electrode layer 150 is deposited over the antiferroelectric film 140. In some embodiments, the top electrode layer 150 may include suitable conductive materials, such as TaN, TiN, W, Pt, Mo, Ta, Ti, metal silicide, the like, and/or the combination thereof. The top electrode layer 150 can be a single-layered structure or a multi-layered structure including plural stacked layers of metals and/or metal-containing compounds. The top electrode layer 150 may be exemplarily formed by CVD, PVD (e.g., sputtering deposition), ALD, the like, and/or the combination thereof. In some embodiments, a thickness of the top electrode layer 150 may be in a range from about 1 nanometer to about 1000 nanometers. In some other embodiments, the top electrode layer 150 may have other suitable thickness. The top electrode layer 150 may include a conductive material the same as or different from that of the bottom electrode layer 120.

Figure 9:
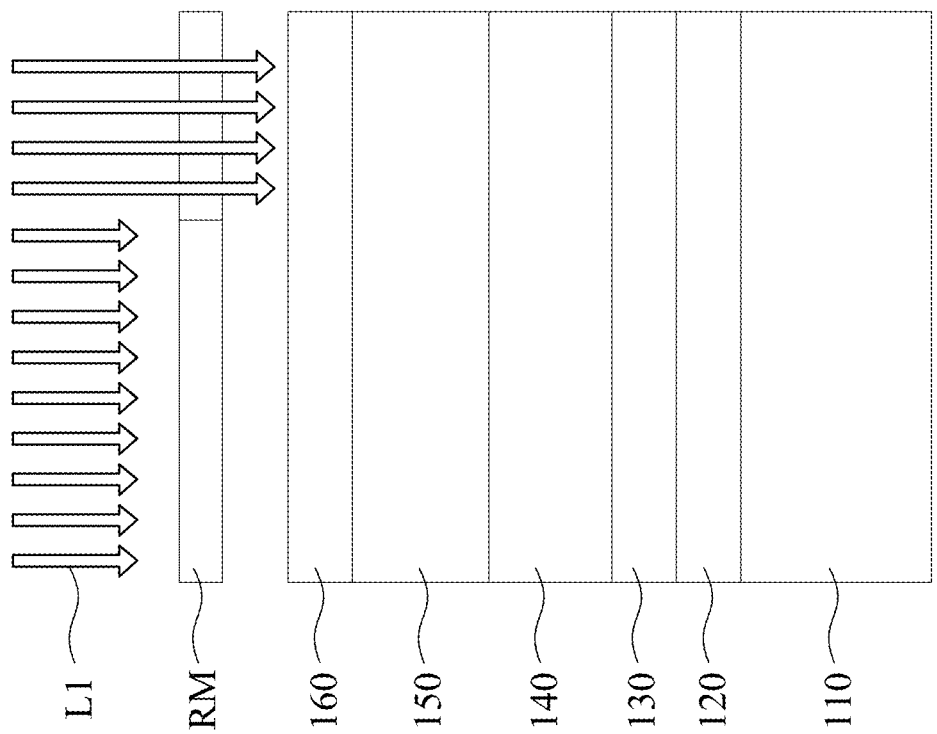

Reference is made to FIG. 9. A resist layer 160 is formed over the top electrode layer 150. In some embodiments, the resist layer 160 is an ashing removable dielectric (ARD), which is a photoresist-like material generally having generally the properties of a photoresist and amendable to etching and patterning like a photoresist. The resist layer 160 may also acts as a mask layer for patterning underlying layers in some embodiments. In some embodiments, the resist layer 160 includes an organic material, such as polymer. In some embodiments, the resist layer 160 includes SiON. The resist layer 160 may be formed by spin-on coating, CVD, PVD, ALD, or other suitable processes. In some embodiments, an exposure apparatus including a light source and a mask RM is used for providing light L1 for the exposing the resist layer 160. The resist layer 160 may be patterned using suitable photolithography process, thereby forming the patterned resist layer 160' (referring to FIG. 10). For example, the process may include photoresist coating (e.g., spin-on coating), soft baking, mask aligning, exposure, post-exposure baking, developing the photoresist, rinsing, drying (e.g., hard baking), other suitable processes, or combinations thereof.

Figure 10:
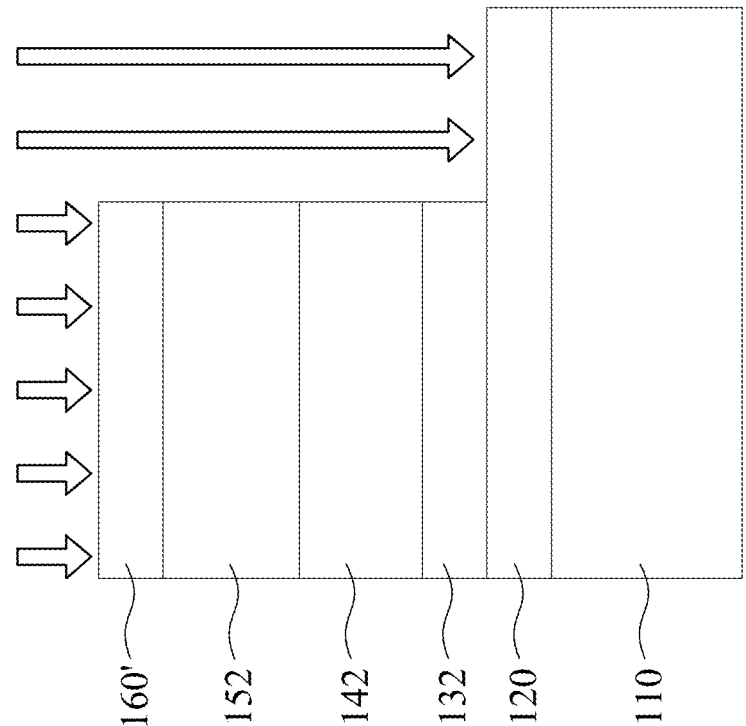

Reference is made to FIG. 10. One or more etching processes are performed to etch portions of the films/layers 130-150 (referring to FIG. 9) through the patterned resist layer 160', such that portions of the films/layers 130-150 (referring to FIG. 9) uncovered by the patterned resist layer 160 are removed. The remaining portions of the films/layers 130-150 (referring to FIG. 9) form the dielectric layer 132, the polarization switching layer 142, and the top electrode 152, respectively. Stated differently, through the photolithography process and the etching process, the films/layers 130-150 (referring to FIG. 9) are patterned into the dielectric layer 132, the polarization switching layer 142, and the top electrode 152, respectively. The one or more etching processes may include a dry etch using fluoride-based etchants, such as $CF_4$. In some embodiments, the bottom electrode layer 120 may have a higher etch resistance to the etchants than that of the dielectric film 130 (referring to FIG. 9), thereby protecting underlying layers from being etched. In some other embodiments, the bottom electrode layer 120 may also be patterned through the etching process.

Figure 11:
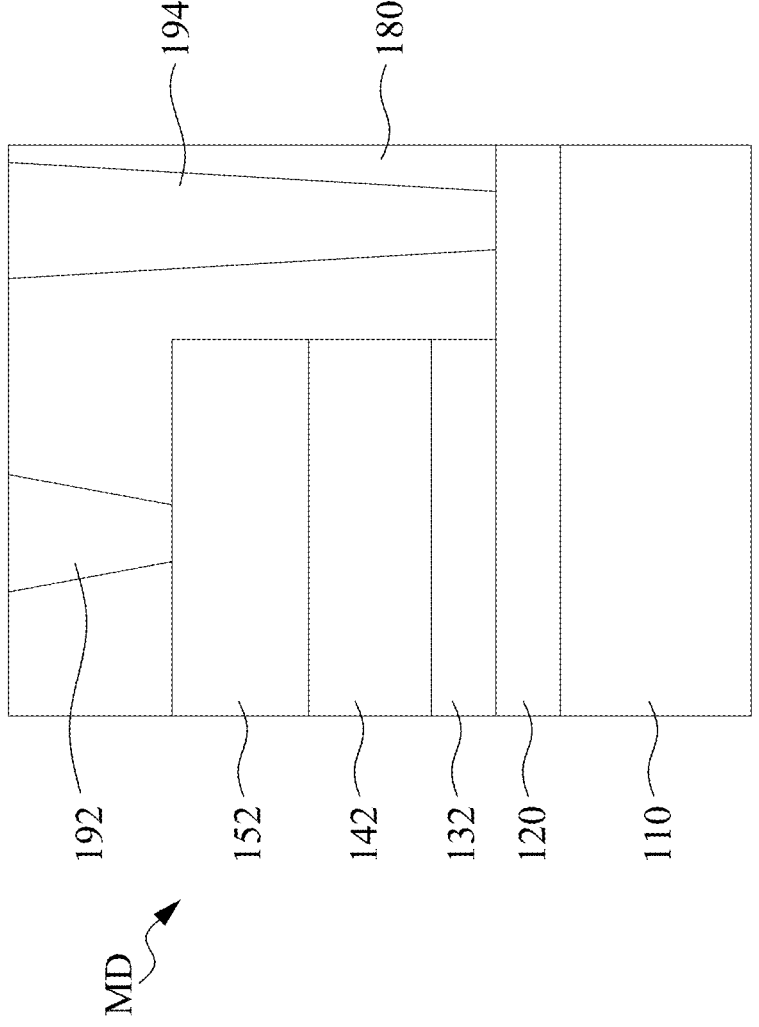

After the patterning process, an annealing process may be performed to the structure, resulting a memory device as shown in FIG. 11. The annealing process may include rapid thermal annealing (RTA) process, laser-spike annealing (LSA), furnace annealing, microwave annealing, flash annealing, the like, or the combination thereof. In some embodiments where RTA process is performed, a chamber pressure may be in a range from about 0.001 atm to about 1 atm, and a annealing temperature may be in a range from about 300 Celsius degrees to about 1000 Celsius degrees. Gases introduced to the RTA environment are inert to reactions, such as $N_2$, Ar, He, Ne, Kr, Xe, Rn, the like, or the combination thereof.

As shown in FIG. 11, a memory device MD is formed. The memory device MD includes the bottom electrode 120, the dielectric layer 132, the polarization switching layer 142, and the top electrode 152, respectively corresponding to the bottom electrode BE, the dielectric layer DI, the polarization switching layer PS, and the top electrode TE in FIG. 1.

In some embodiments, an inter-layer dielectric (ILD) layer 180 may be formed around the memory device MD. The ILD layer 180 may be silicon oxide, fluorinated silica glass (FSG), carbon doped silicon oxide, tetra-ethyl-ortho-silicate (TEOS) oxide, phosphosilicate glass (PSG), boro-phosphosilicate glass (BPSG), Black Diamond® (Applied Materials of Santa Clara, Calif.), amorphous fluorinated carbon, low-k dielectric material, the like or combinations thereof. In some embodiments, a top electrode via 192 and a bottom electrode via 194 may be formed in the interlayer dielectric layer 180, and landing on a top surface of the top electrode 152 and a top surface of the bottom electrode layer 120, respectively. Formation of the vias 192 and 194 may include etching openings in the ILD layer 180, and filling the openings with suitable conductive materials, followed by a planarization process (e.g., chemical mechanical polish (CMP) process). The vias 192 and 194 may include suitable conductive materials, such as aluminum, aluminum alloy, copper, copper alloy, titanium, titanium nitride, tantalum, tantalum nitride, tungsten, cobalt, the like, and/or combinations thereof. In some other embodiments, the bottom electrode layer 120 may be electrically connected with underlying interconnect layers, and the bottom electrode via 194 may be omitted.

Figure 13:
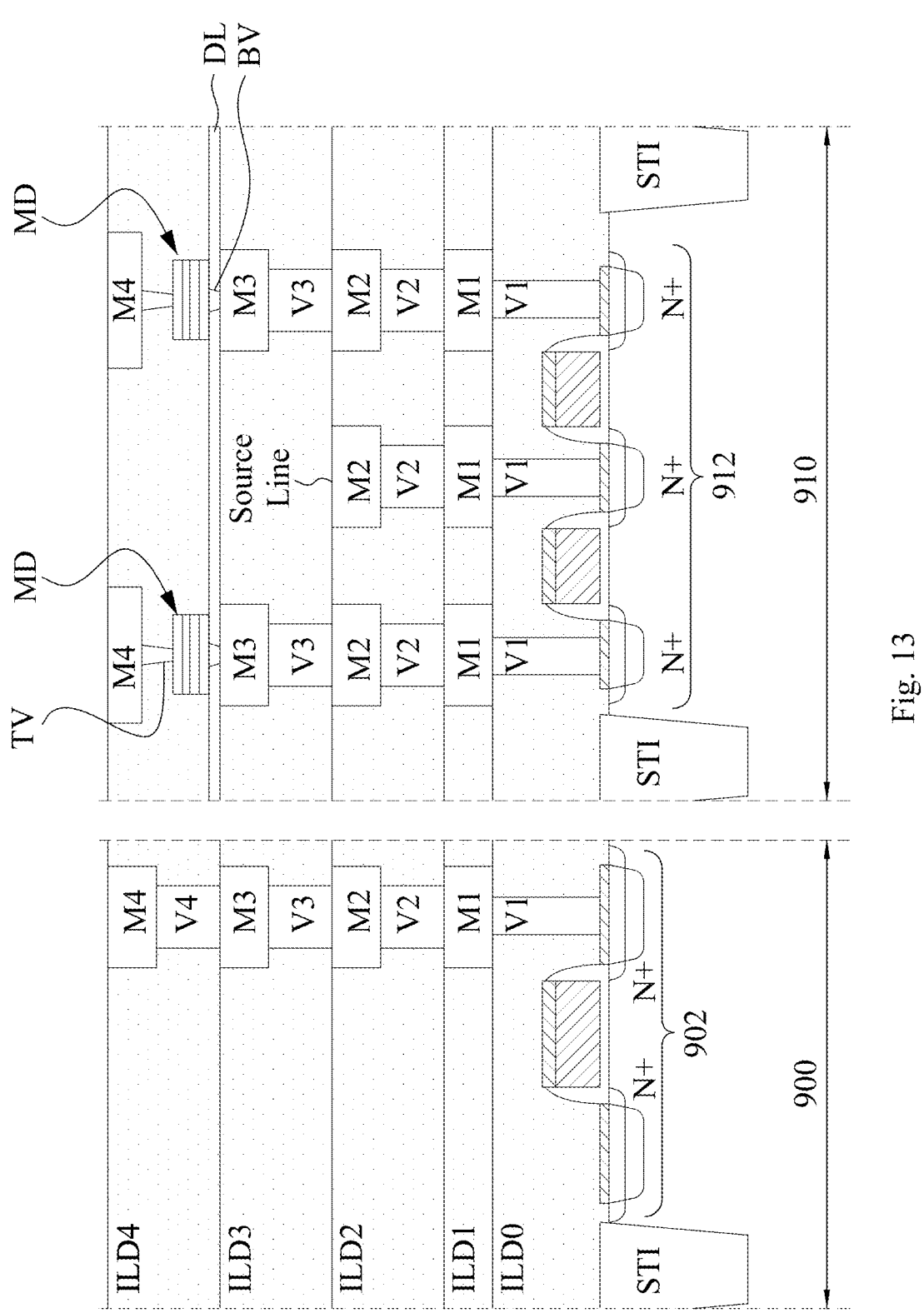
FIG. 13 is a schematic cross-sectional view of an integrated circuit device having a memory device in accordance with some embodiments of the present disclosure.

FIG. 13 is a schematic cross-sectional view of an integrated circuit device having a memory device MD in accordance with some embodiments of the present disclosure. The integrated circuit device includes a logic region 900 and a memory region 910. Logic region 900 may include circuitry, such as an exemplary logic transistor 902, for processing information received from the memory device MD in the memory region 910 and for controlling reading and writing functions of the memory device MD. In some embodiments, the memory device MD may be similar to those shown above. In some embodiments, the memory device MD is located on a bottom electrode via BV connected to underlying metallization layer. The formation of the bottom electrode via BV may include depositing a dielectric layer DL, etching an opening in the dielectric layer DL, and filling the opening with suitable conductive material, followed by a CMP process.

As depicted, the integrated circuit device is fabricated using four metallization layers, labeled as M1 through M4, with four layers of metallization vias or interconnects, labeled as V1 through V4. Other embodiments may contain more or fewer metallization layers and a corresponding more or fewer number of vias. Logic region 900 includes a full metallization stack, including a portion of each of metallization layers M1-M4 connected by interconnects V2-V4, with V1 connecting the stack to a source/drain contact of logic transistor 902. The memory region 910 includes a full metallization stack connecting memory device MD to transistors 912 in the memory region 910, and a partial metallization stack connecting a source line to transistors 912 in the memory region 910. Memory device MD are depicted as being fabricated in between the top of the M3 layer and the bottom the M4 layer. In the illustrated embodiments, a top electrode via TV connects the top electrode TE to the M4 layer, and a bottom electrode via BV connects the bottom electrode BE to the M3 layer. Also included in semiconductor device is a plurality of ILD layers. Five ILD layers, identified as ILD0 through ILD4 are depicted as spanning the logic region 900 and the memory region 910. The ILD layers may provide electrical insulation as well as structural support for the various features of the semiconductor device during many fabrication process steps.

FIGS. 14-16 illustrate various circuit diagrams of integrated circuit devices having memory devices MD in accordance with some embodiments of the present disclosure. Concerning memory applications, there are various array architectures for memory integration. FIG. 14 shows a one-transistor-one-resistor (1T1R) circuit. Word lines WL handle the memory devices MD that are connected between bit lines BL and source lines, in which the source lines are grounded and omitted. The word lines WL are connected to gates of the switch transistors SWD. The switch transistors SWD act as switches to turn on the access to the memory device MD once addressed and programmed, controls the current flowing through the memory device MD at ON state, and turns off the transistor SWD once the memory device MD is unselected. The switch transistor SWD may isolate the electrical current to cells that are selected from those that are not. FIG. 15 shows a two-transistor-one-resistor (2T1R) circuit, where transistors TD and lines RL for read pulses are used, and the memory devices MD are connected to gates of transistors TD. The switch transistors SWD and the transistors TD may be any suitable transistors, such as planar field effect transistor (FET), nanowire FET, nanosheet FET, Fin-FET, omega-FET, gate-all-around (GAA) FET. FIG. 16 shows a one-selector-one-resistor (1S1R) circuit, where the selector SLD isolates the electrical current to cells that are selected from those that are not. The selector SLD may be an element having a rectification function. Compared to the 1T1R circuit and 2T1R circuit, 1S1R circuit uses less terminals (e.g., bit line BL and word line WL), and can therefore enable higher density integration. The crossbar architecture provides great potential for high-density memory array implementation, in which the cell size could be as small as $4F^2$ (F is the minimum feature size).

Figure 17B:
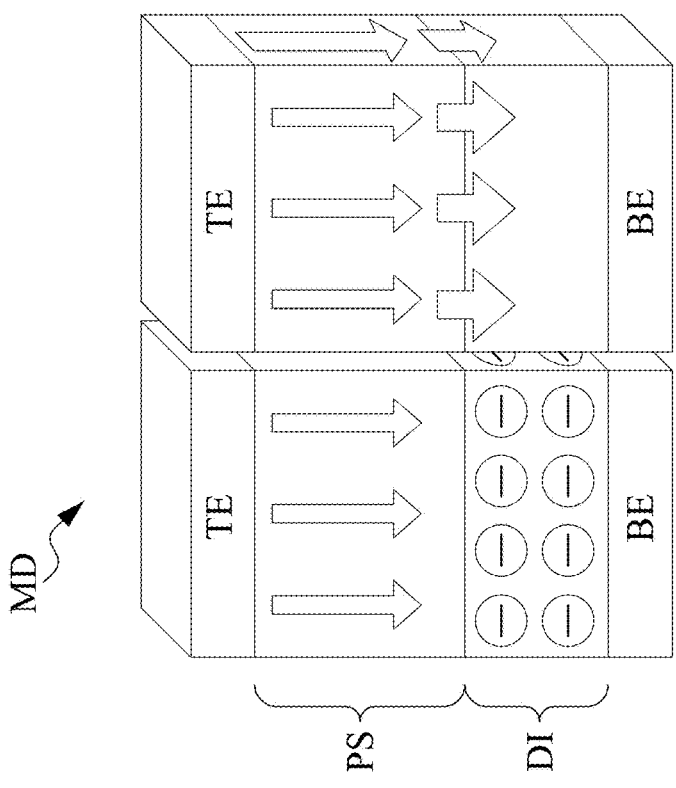
FIG. 17B is a schematic diagram of the memory device illustrated in FIG. 17A.
Figure 17A:
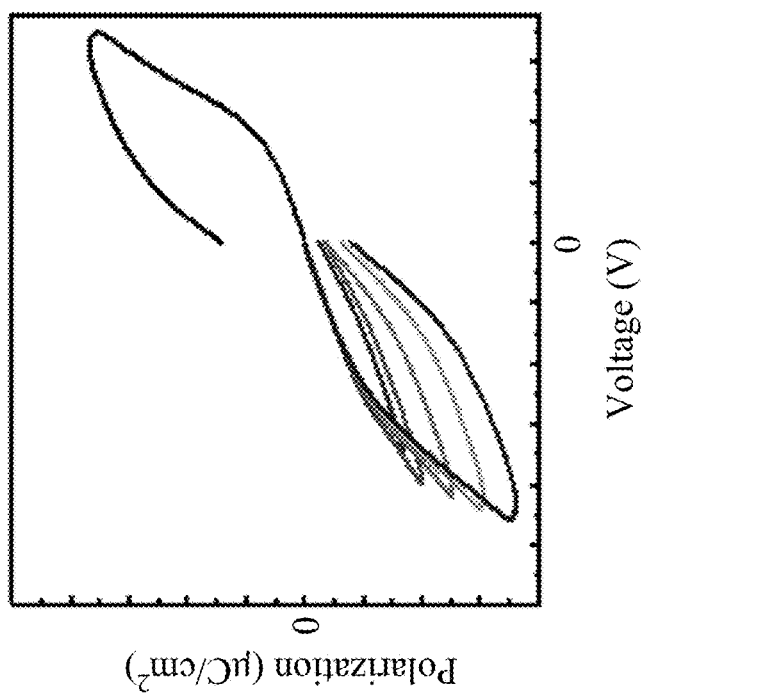
FIG. 17A is a graph showing polarization hysteresis loop of a memory device with a bilayer tunneling junction according to some embodiments of the present disclosure.

FIG. 17A is a graph showing polarization hysteresis loops of a memory device with a bilayer tunneling junction according to some embodiments of the present disclosure. FIG. 17B is a schematic diagram of the memory device illustrated in FIG. 17A. Reference is made to FIGS. 17A and 17B. The polarization ($\mu C/cm^2$) is shown on the vertical axis, and the voltage applied across the polarization switching layer PS (e.g., applied on the bottom electrode BE and/or the top electrode TE) is shown on the horizontal axis. In the examples, the memory device MD has a bilayer tunneling junction of an antiferroelectric layer PS and a dielectric layer DI. The dielectric layer DI may include $Al_2O_3$ in the present embodiments. In FIG. 17A, each of the voltage sweeps may include a forward sweep from about 0V to a determined negative/positive voltage, and a backward sweep from the determined negative/positive voltage to about 0V. The P-V characteristics of the bilayer tunneling junction show non-volatile memory (NVM) characteristics due to the built-in field origins from fixed charges at $Al_2O_3$ and/or dipole at the interface of IUD and $Al_2O_3$ by asymmetric oxygen density, and the schematic diagram is shown in FIG. 17B. The P-V characteristics of the bilayer tunneling junction exhibits a double-hysteresis loop against changes of the voltages, which demonstrates the antiferroelectric characteristics. One of the P-V loops of AFE could be used for FE behavior under built-in field to make nonzero remnant polarization ($P_r$) exist at 0 volts. In order to prove the existence of the built-in field, the AFE behavior can be obtained in the AFE with $Al_2O_3$ system by asymmetric bias to overcome the built-in field, as shown in the figure.

Figure 18:
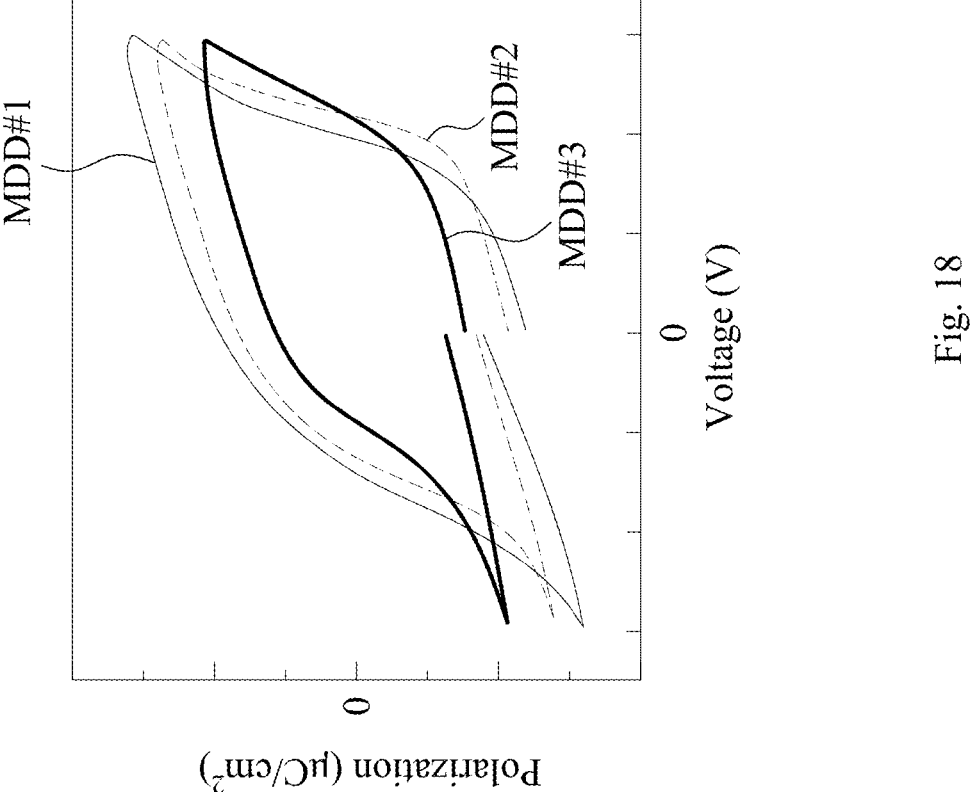
FIG. 18 is a graph showing polarization hysteresis loops of memory devices with a bilayer tunneling junction according to some embodiments of the present disclosure.

FIG. 18 is a graph showing polarization hysteresis loops of memory devices with a bilayer tunneling junction according to some embodiments of the present disclosure. In FIG. 18, the polarization ($\mu C/cm^2$) is shown on the vertical axis, and the voltage applied across the polarization switching layer PS (e.g., applied on the bottom electrode BE and/or the top electrode TE) is shown on the horizontal axis. In FIG. 18, each of the memory devices MDD #1, MDD #2, and MDD #3 has a bilayer tunneling junction of a polarization switching layer and a dielectric layer (e.g., $Al_2O_3$), the polarization switching layers of the memory devices MDD #1, MDD #2, MDD #3 have different ratios of a Zr content to a sum of Zr content and Hf content in HZO. For example, for the memory device MDD #1, the ratio of the Zr content to the sum of Zr content and Hf content in $H_2O$ may be about 50%, and the polarization switching layer may be $Hf_{0.5}Zr_{0.5}O_2$. For the memory device MDD #2, the ratio of the Zr content to the sum of Zr content and Hf content in $H_2O$ may be about 75%, and the polarization switching layer may be $Hf_{0.25}Zr_{0.75}O_2$. For the memory device MDD #3, the ratio of the Zr content to the sum of Zr content and Hf content in $H_2O$ may be about 90%, and the polarization switching layer may be $Hf_{0.1}Zr_{0.9}O_2$. The memory device MDD #1 is considered as having FTJ, while the memory device MDD #2 and MDD #3 may be considered as having AFTJ. In the figure, the voltage sweep includes a forward sweep from a determined negative voltage to a determined positive voltage, and a backward sweep from the determined positive voltage to the determined negative voltage. The memory device MDD #1, MDD #2, and MDD #3 show P-V hysteresis.

Figure 19:
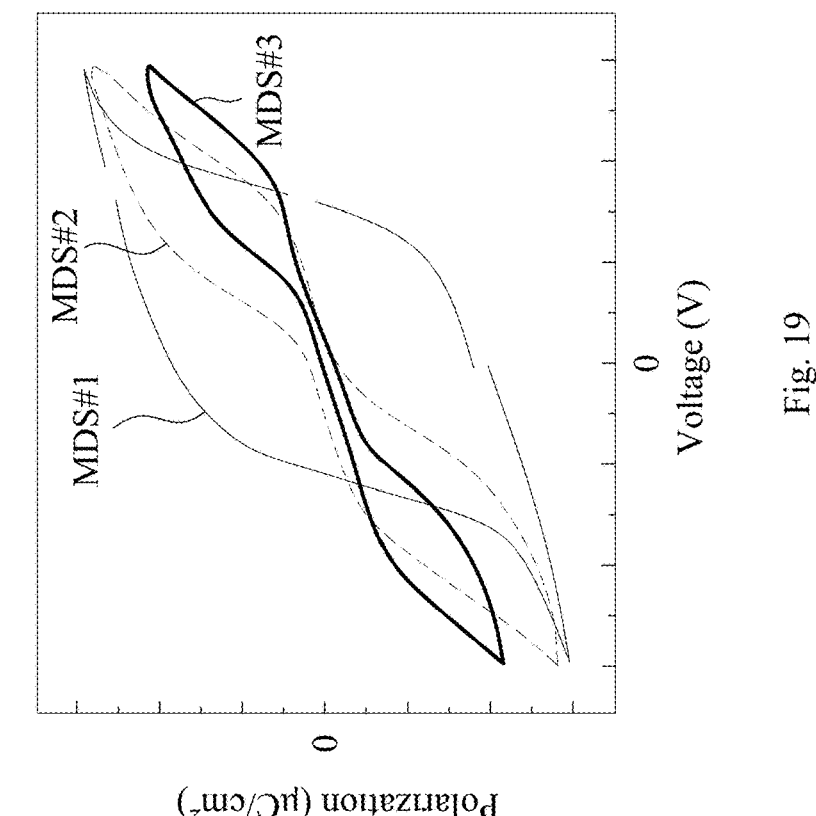
FIG. 19 is a graph showing polarization hysteresis loops of memory devices with single-layered tunneling junction according to some embodiments of the present disclosure.

FIG. 19 is a graph showing polarization hysteresis loops of memory devices with a single-layered tunneling junction according to some embodiments of the present disclosure. In FIG. 19, the polarization ($\mu C/cm^2$) is shown on the vertical axis, and the voltage applied across the polarization switching layer PS (e.g., applied on the bottom electrode BE and/or the top electrode TE) is shown on the horizontal axis. In FIG. 19, each of the memory devices MDS #1, MDS #2, and MDS #3 has a single-layered tunneling junction, in which the polarization switching layers of the memory devices MDS #1, MDS #2, MDS #3 have different ratios of a Zr content to a sum of Zr content and Hf content in HZO, for example, respectively 50%, 75%, and 90% as aforementioned. In FIG. 19, the memory device MDS #1, MDS #2, and MDS #3 show P-V hysteresis. Furthermore, the memory devices MDS #2 and MDS #3 show double-hysteresis loop against changes of the voltages, which demonstrates the antiferroelectric characteristics.

Figure 20:
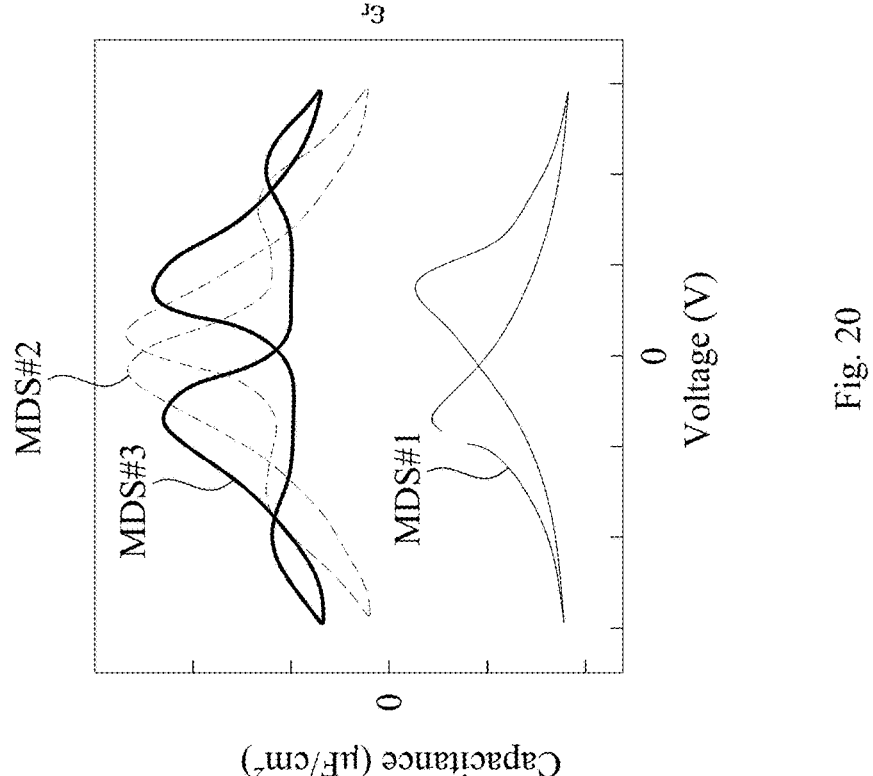
FIG. 20 is a graph showing capacitance to voltage (C-V) dependences of memory devices as illustrated in FIG. 19.

FIG. 20 is a graph showing capacitance to voltage (C-V) dependences of the memory devices MDS #1, MDS #2, MDS #3 as illustrated in FIG. 19. In FIG. 20, the capacitance is shown on the left vertical axis, and the voltage applied across the polarization switching layer PS (e.g., applied on the bottom electrode BE and/or the top electrode TE) is shown on the horizontal axis. Dielectric constant (relative permittivity) is further shown on the right vertical axis. In FIG. 20, the memory devices MDS #2 and MDS #3 have a greater capacitance than the memory device MDS #1, which indicates that the antiferroelectric layer may have a dielectric constant greater than that of the ferroelectric layer.

Figures 21A, 21B, 21C:
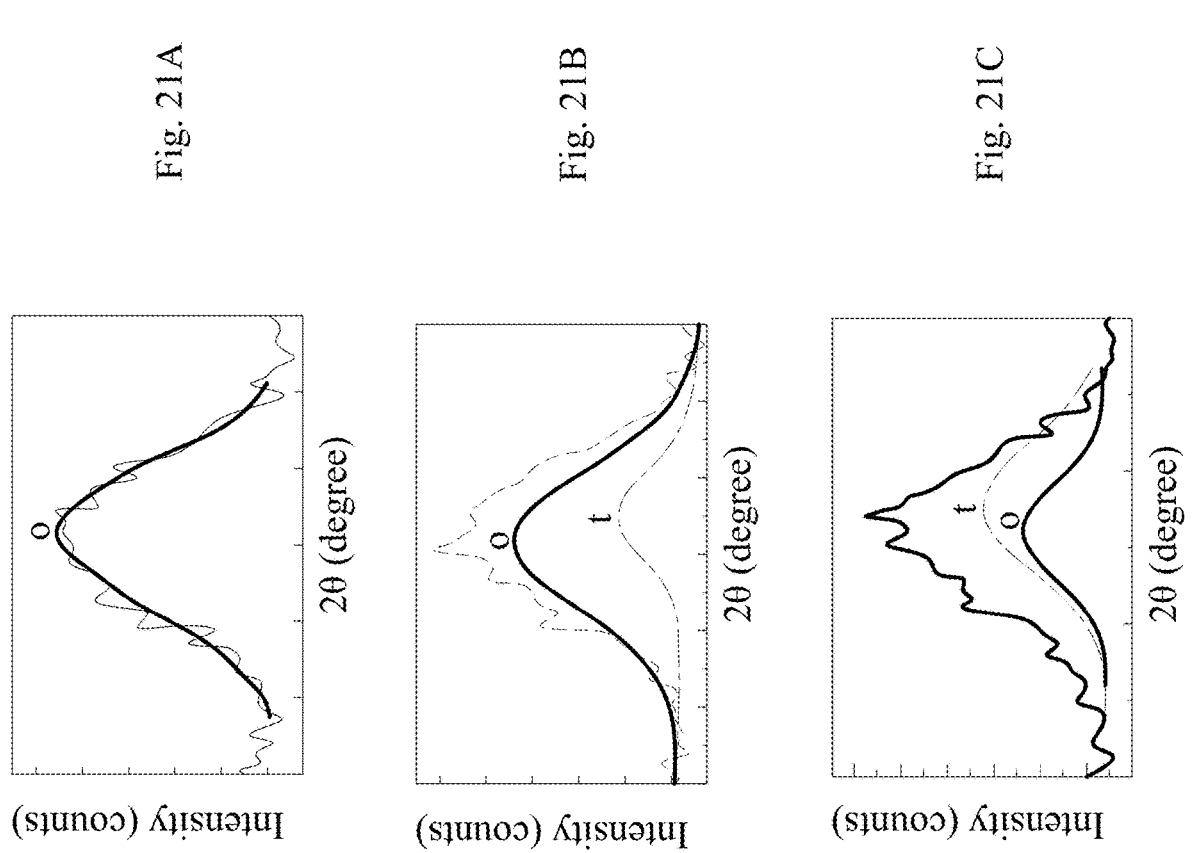
FIGS. 21A-21C are an X-ray diffraction (GIXRD) results of polarization switching layers with different stoichiometries according to some embodiments of the present disclosure.

FIGS. 21A-21C are an X-ray diffraction (GIXRD) results of polarization switching layers with different stoichiometries according to some embodiments of the present disclosure. In FIGS. 21A-21C, the scattering angle (2θ) is shown on the vertical axis, and the intensity (counts) is shown on the horizontal axis. The scattering intensity of all phases of the polarization switching layers are shown. By curve fittings, orthorhombic phase o and tetragonal phase t can be evidenced by GIXRD. FIG. 21A shows the GIXRD result of $Hf_{0.5}Zr_{0.5}O_2$, in which the orthorhombic phase o dominates the curve, and little or no tetragonal phase t (referring to FIGS. 21B and 21C) exists. FIG. 21B shows a GIXRD result of $Hf_{0.25}Zr_{0.75}O_2$, in which the tetragonal phase t and the orthorhombic phase o both exist, and signals of the orthorhombic phase o is more than strong than that of the tetragonal phase t. FIG. 21C may show a GIXRD result of $Hf_{1.0}Zr_{0.9}O_2$, in which the tetragonal phase t and the orthorhombic phase o both exist, and signals of the tetragonal phase t is more than strong than that of the orthorhombic phase o. As confirmed from FIGS. 21A-21C, with the increase of Zr concentration, the tetragonal phase t becomes more dominant. In some embodiments, phase fractions can be extracted experimentally from the XRD result and used in hysteresis modeling. For example, the XRD results may determine a fraction of the tetragonal phase t in the polarization switching layer. For example, the polarization switching layers in FIGS. 21A-21C respectively have about 0%, about 25%, and about 65% tetragonal phase. In some embodiments, the fraction of the tetragonal phase t in the polarization switching layer may be considered to as a ratio of the tetragonal phase t to all phases in the polarization switching layer.

Figure 22:
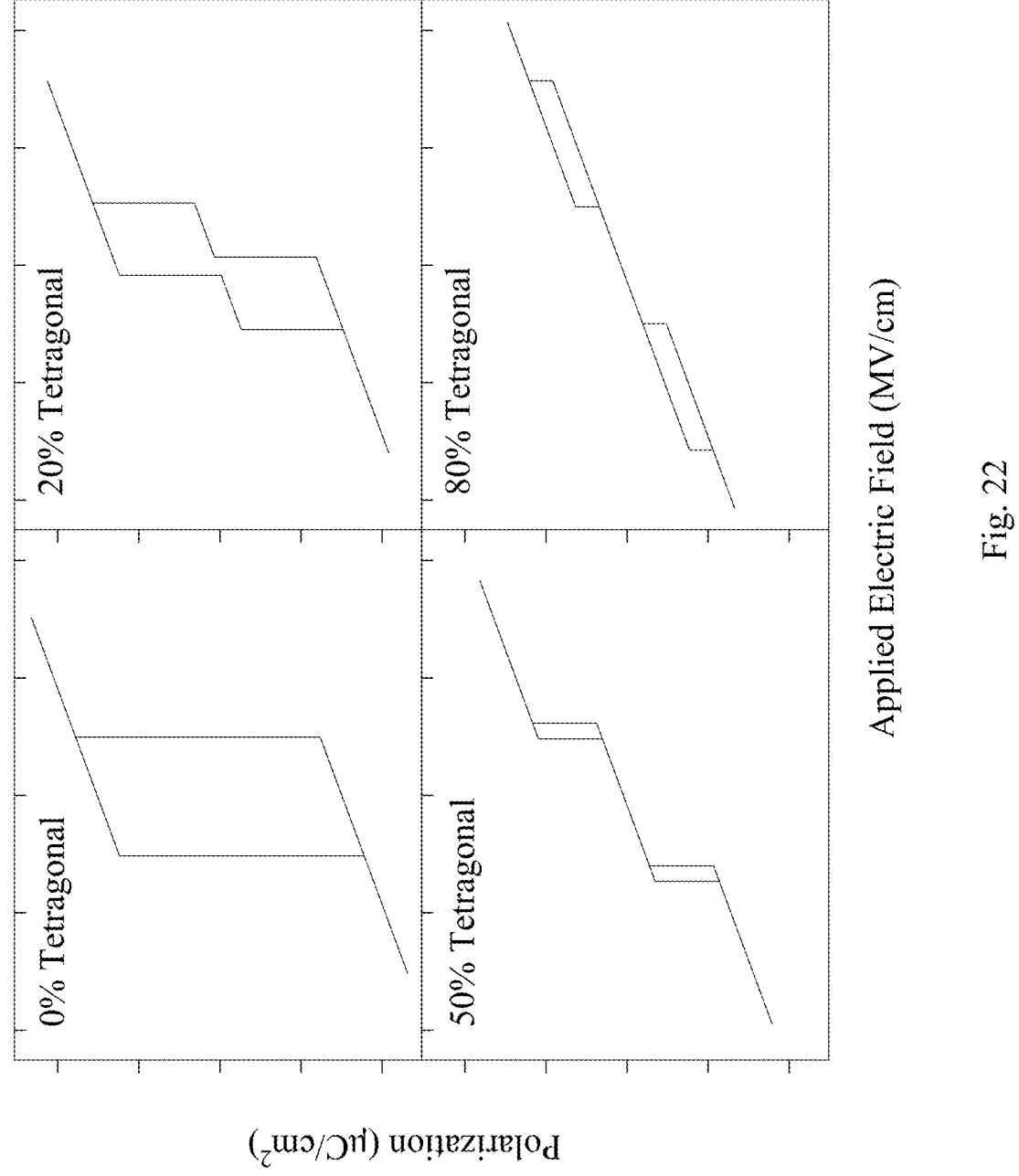
FIG. 22 is a graph showing polarization hysteresis loops of polarization switching layers with various fractions of tetragonal phase according to some embodiments of the present disclosure.

FIG. 22 is a graph showing polarization hysteresis loops of polarization switching layers with various fractions of tetragonal phase according to some embodiments of the present disclosure. In FIG. 22, the polarization ($\mu C/cm^2$) is shown on the vertical axis, and the electric field applied across the polarization switching layer is shown on the horizontal axis. FIG. 22 includes four parts respectively showing P-E hysteresis of four polarization switching layers, which respectively have 0%, 20%, 50%, and 80% tetragonal phase. And, the vertical and horizontal axis of the four parts are substantially the same. As confirmed from FIG. 22, with the increase of tetragonal phase, a double-hysteresis loop, which demonstrates the antiferroelectric characteristics, becomes more dominant. As a result, for antiferroelectric characteristics, it is desire to maintaining the fraction of the tetragonal phase in the antiferroelectric layer, for example, in a range from about 20% to about 100%. On the other hand, a fraction of the orthorhombic phase in the antiferroelectric layer may be in a range from about 0% to about 80%. As FIGS. 21A-21C indicates the dependency between the Zr concentration and the fraction of tetragonal phase, when HZO is used as the polarization switching layer, HZO is designed with a ratio of the Zr content to the sum of Zr content and Hf content greater than 50%, thereby maintaining the exitance of the tetragonal phase and achieving the antiferroelectric characteristic.

Figure 23:
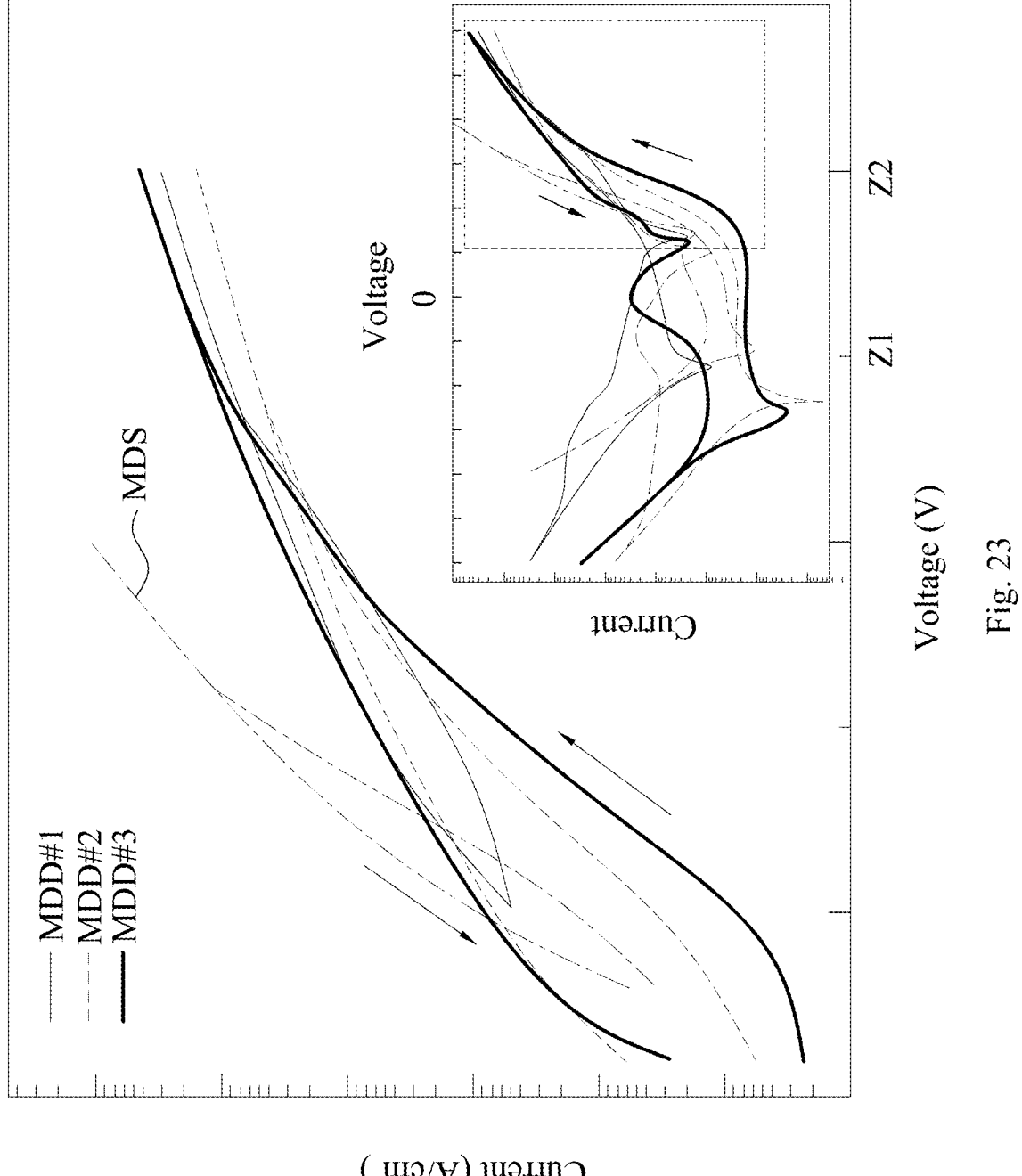
FIG. 23 is a graph showing current to voltage (I-V) dependences of memory devices according to some embodiments of the present disclosure.

FIG. 23 is a graph showing current to voltage (I-V) dependences of memory devices according to some embodiments of the present disclosure. The I-V characteristics are respectively measured under direct-current (DC) voltage sweeps. The inset in FIG. 23 show full ranges of the DC voltage sweeps, and the dashed blocks in the inset indicates the enlarged portion as shown by FIG. 23. The bilayered memory, devices MDD #1, MDD #2, and MDD #3 may have a larger voltage range than that of the single-layered memory device MDS because voltage may drop in the dielectric layer. The bilayered memory devices MDD #1, MDD #2, and MDD #3 have similar on-state currents ($I_{on}$), as discussed with respect to FIG. 2A. Comparing the bilayered memory devices MDD #1, MDD #2, and MDD #3 to each other, the ATJ memory devices MDD #2 and MDD #3 have a lower off-state current ($I_{off}$) than that of the FTJ memory devices MDD #1, as discussed with respect to FIG. 2B. In the present embodiments, the single-layered memory device MDS may have a thinner polarization switching layer MDS than that of the bilayered memory devices MDD #1, MDD #2, and MDD #3 for increasing its on-state current ($I_{on}$).

Figure 24:
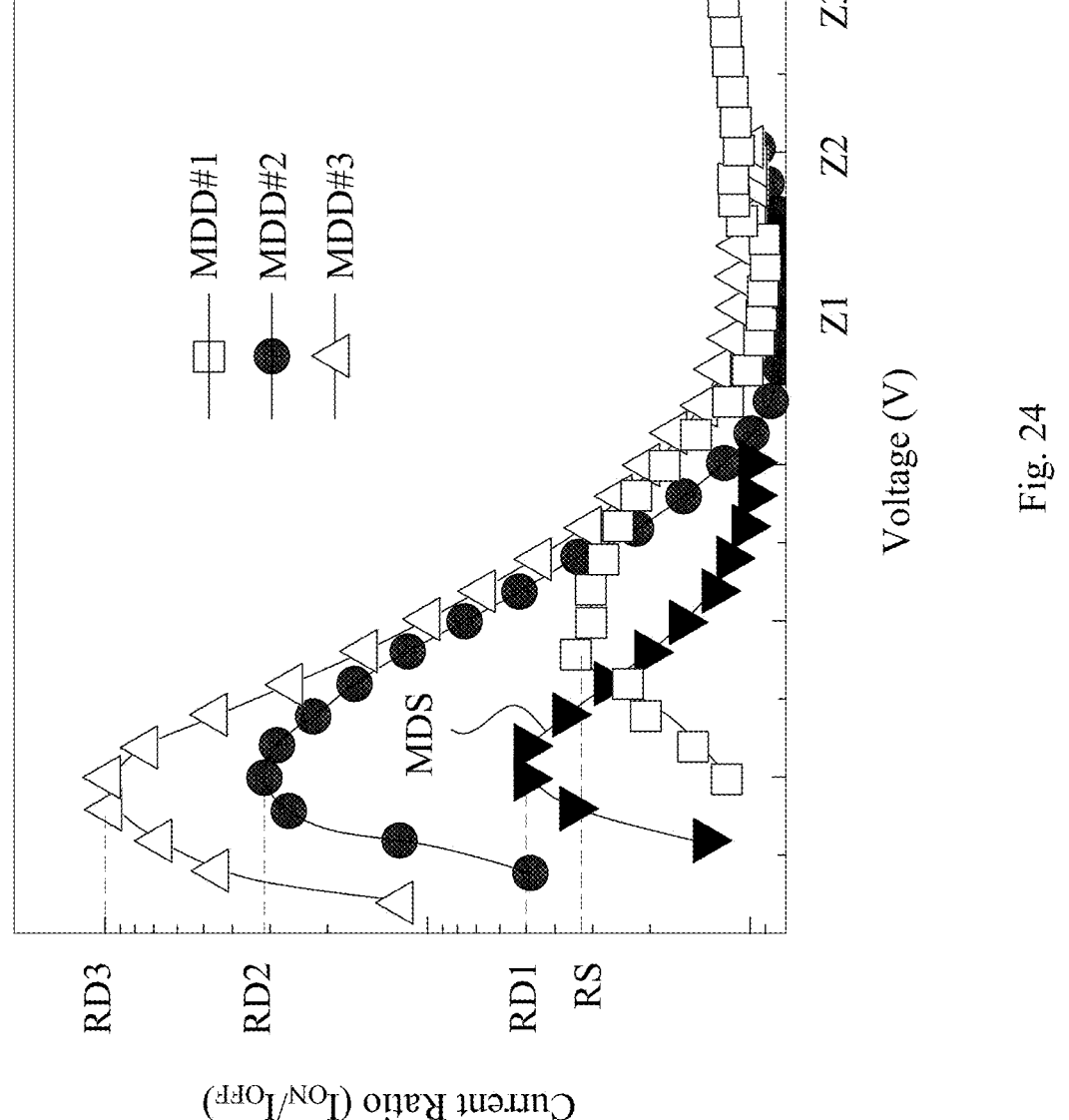
FIG. 24 is a graph showing current ratio to voltage dependences of the memory devices of FIG. 23.

FIG. 24 is a graph showing current ratio to voltage dependences of the memory devices of FIG. 23. The I-V curves in FIG. 23 are respectively divided by their off-state current ($I_{off}$), thereby obtaining the current ratio to voltage dependences. As confirmed by FIG. 24, the greatest current ratio RD1, RD2, and RD3 of the bilayered memory devices MDD #1, MDD #2, and MDD #3 are greater than a greatest current ratio RS of the single-layered memory device MDS. Furthermore, comparing the bilayered memory devices MDD #1, MDD #2, and MDD #3 to each other, the greatest current ratios RD2 and RD3 of the ATJ memory devices MDD #2 and MDD #3 are higher than the greatest current ratio RD1 of the FTJ memory devices MDD #1. For example, the greatest current ratio RD1 of the memory devices MDD #1 may be less than about 10%, the greatest current ratio RD2 of the memory devices MDD #2 may be in a range from about 40% to about 60%, and the greatest current ratio RD3 of the memory devices MDD #3 may be greater than about 1.00%. Voltages corresponding to the greatest current ratios may serve as reading voltages for the memory devices, respectively. For example, for the memory devices MDS, MDD #1, MDD #2, and MDD #3, the reading voltages decrease in a sequence.

Figure 25:
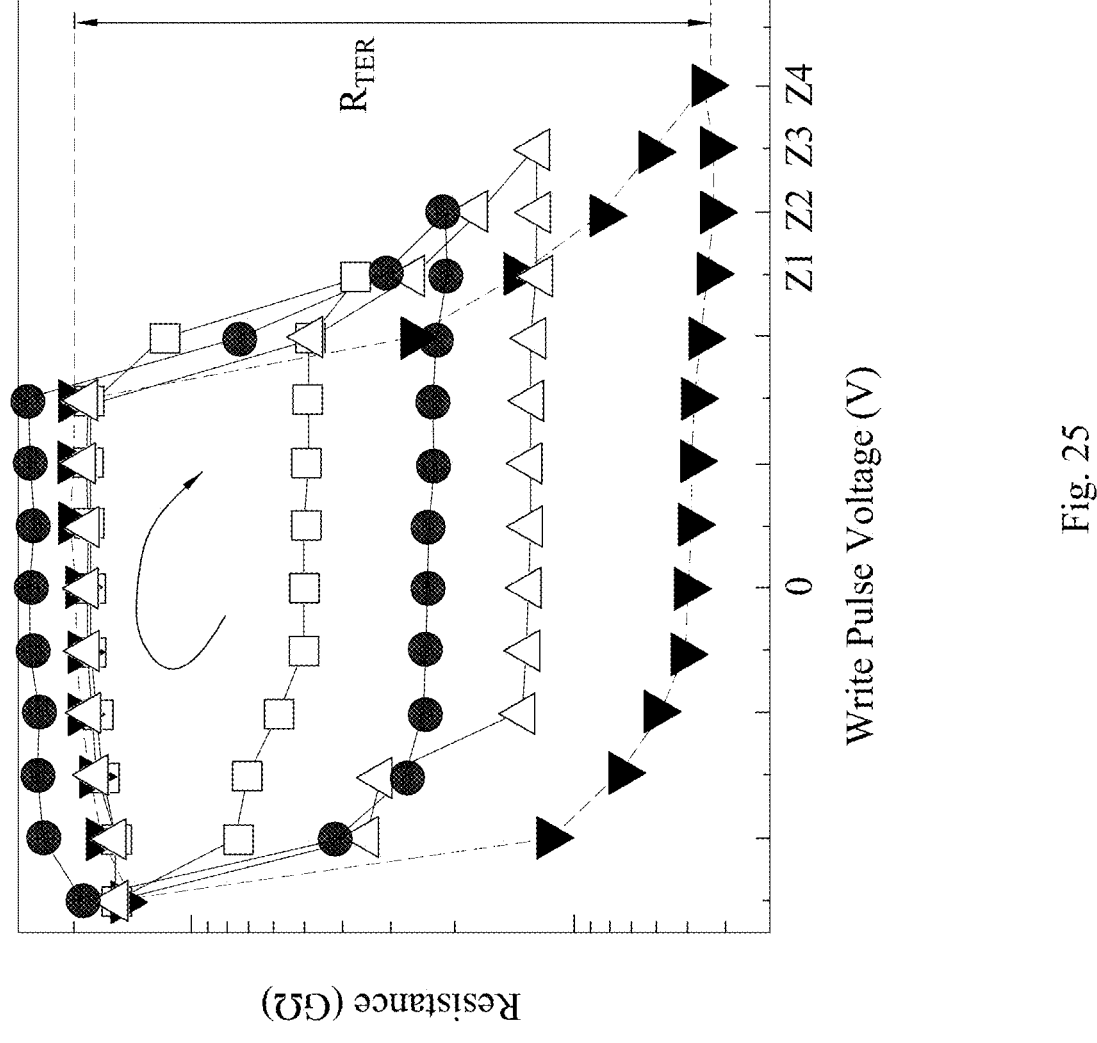
FIG. 25 is a graph showing resistance to writing voltage pulse dependences of a memory device according to some embodiments of the present disclosure.

FIG. 25 is a graph showing resistance to writing/programing voltage pulse dependences of the memory device MDD #3 according to some embodiments of the present disclosure. The R-V characteristics are respectively measured under pulse voltage sweeps. In the figure, each of the pulse voltage sweeps includes a forward pulse sweep from a determined negative voltage to a determined positive voltage (e.g., voltages Z1-Z4), and a backward pulse sweep from the determined positive voltage (e.g., voltages Z1-Z4) to the determined negative voltage. The determined positive voltage (e.g., voltages Z1-Z4) varies for different pulse voltage sweeps. In FIG. 25, the memory device MDD #3 have different states of resistances. It indicates that the AFTJ memory device can be used for multi-level memory application. As the AFTJ has an off-state current less than that of the FTJ, the AFTJ may have a greater tunneling electroresistance (TER) ratio. For example, as confirmed by FIG. 25, the memory device MDD #3 has a tunneling electroresistance (TER) ratio R TER greater than about 50%.

Figures 26, 27, 28:
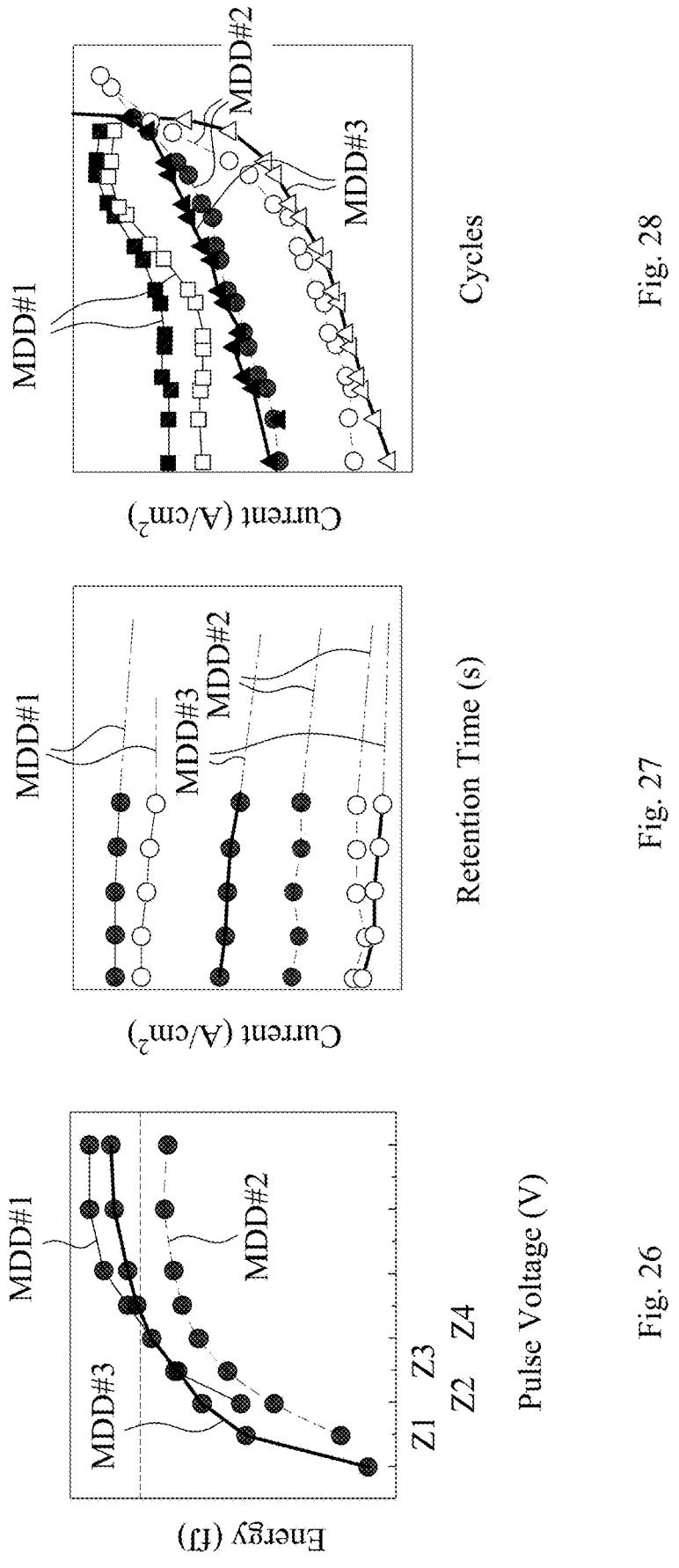
FIG. 26 is a graph showing programing energy consumption of the memory devices according to some embodiments of the present disclosure.
FIG. 27 is a graph showing data retention of the memory devices according to some embodiments of the present disclosure.
FIG. 28 is a graph showing endurance of the memory devices according to some embodiments of the present disclosure.

FIG. 26 is a graph showing programing energy consumption of the memory devices according to some embodiments of the present disclosure. The dashed line in FIG. 26 indicates an energy level of femto-joule (fj). The memory devices MDD #1, MDD #2, and MDD #3 exhibit sub-fJ programming capacity. In FIGS. 23-26, voltages Z1-Z4 are annotated for indicating the same voltage level. When memory devices are programed with less energy consumption, the AFTJ bilayered memory device MDD #2 and MDD

3 can achieve larger current ratio and larger TRE ratio than the FTJ bilayered memory device MDD #1.

FIG. 27 is a graph showing data retention of the memory devices according to some embodiments of the present disclosure. The empty dots in FIG. 27 indicate the memory devices are programed at off-state, and the solid dots in FIG. 27 indicate the memory devices are programed at on-state. In FIG. 27, the memory devices MDD #1, MDD #2, and MDD #3 may exhibit retention time greater than several years (e.g., 10 years). The AFTJ bilayer memory devices MDD #2 and MDD #3 may have longer retention time than that of the FTJ bilayer memory devices MDD #1. For example, the AFTJ bilayer memory devices MDD #2 and MDD #3 may have retention time longer than 4 seconds.

FIG. 28 is a graph showing endurance of the memory devices according to some embodiments of the present disclosure. The empty dots in FIG. 28 indicate the memory devices are programed at off-state, and the solid dots in FIG. 28 indicate the memory devices are programed at on-state. The AFTJ bilayer memory devices MDD #2 and MDD #3 may have greater endurance than that of the FTJ bilayer memory devices MDD #1. For example, the AFTJ bilayer memory devices MDD #2 and MDD #3 may exhibit endurance greater than about $10^8$ cycles.

According to the above measurements, the AFTJ bilayer memory devices may exhibit lower off-state current, large current ratio, low reading voltage, large TER ratio, long energy consumption, long retention time, high endurance. The antiferroelectric layer of the AFTJ bilayer memory devices may include $Hf_xZr_{1-x}O_2$, $Hf_xAl_{1-x}O_2$ or $Hf_xSi_{1-x}O_2$, in which x may be in a range from greater than 0% and less than 50% for antiferroelectric characteristics. Stated differently, a ratio of a Zr/Al/Si content to a sum of Zr/Al/Si content and Hf content in $H_2O$ is greater than 50% and less than 100%. In some further embodiments, x may be in a range from greater than 0% and less than 40% for further enhancing the antiferroelectric characteristics. Stated differently, a ratio of a Zr/Al/Si content to a sum of Zr/Al/Si content and Hf content in $H_2O$ is greater than 60% and less than 100%. In some further embodiments, x may be in a range from greater than 0% and less than 25% for further enhancing the antiferroelectric characteristics. Stated differently, a ratio of a Zr/Al/Si content to a sum of Zr/Al/Si content and Hf content in $H_2O$ is greater than 75% and less than 100%.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that a bi-layer antiferroelectric tunnel junction (AFTJ) structure including metal-antiferroelectric-insulator-metal is developed, in which the higher permittivity ($\varepsilon_r$) of the antiferroelectric layer enhances voltage drop in the dielectric layer and suppresses OFF current tunneling. Another advantage is that the bi-layer AFTJ structure is beneficial for reducing operation voltage, low energy consumption, and enhancing tunneling electro-resistance ratio and current ratio. Still another advantage is that the bi-layer AFTJ structure has a good data retention ability for non-volatile memory and a high endurance.

According to some embodiments of the present disclosure, an integrated circuit device includes a substrate and a memory device over the substrate. The memory device includes a bottom electrode, a dielectric layer, an antiferroelectric layer, and a top electrode. The dielectric layer is over the bottom electrode. The antiferroelectric layer is over the dielectric layer. The top electrode is over the antiferroelectric layer.

According to some embodiments of the present disclosure, an integrated circuit device includes a substrate, an interconnect layer over the substrate, and a memory device over a conductive feature of the interconnect layer. The memory device includes a bottom electrode, a dielectric layer, an antiferroelectric layer, and a top electrode. The dielectric layer is over the bottom electrode. The antiferroelectric layer is over the dielectric layer. The antiferroelectric layer has a thickness greater than a thickness of the dielectric layer. The top electrode is over the antiferroelectric layer.

According to some embodiments of the present disclosure, a method for fabricating an integrated circuit device is provided. The method includes depositing a bottom electrode layer over a substrate; depositing a dielectric film over the bottom electrode layer; depositing an antiferroelectric film over the dielectric film by an atomic layer deposition (ALD) process, wherein the ALD process comprises a plurality of cycles, and each of the cycles comprises at least one hafnium-containing precursor pulse and at least one zirconium-containing precursor pulse, wherein a number of the at least one zirconium containing precursor pulse is greater than a number of the at least one hafnium-containing precursor pulse; and depositing a top electrode layer over the antiferroelectric film.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating an integrated circuit device, comprising:
    depositing a bottom electrode layer over a substrate;
    depositing a dielectric film over the bottom electrode layer;
    depositing an antiferroelectric film over the dielectric film by an atomic layer deposition (ALD) process, wherein the ALD process comprises a plurality of cycles, and each of the cycles comprises at least one hafnium-containing precursor pulse and at least one zirconium-containing precursor pulse, wherein a number of the at least one zirconium containing precursor pulse is greater than a number of the at least one hafnium-containing precursor pulse; and
    depositing a top electrode layer over the antiferroelectric film.

2. The method of claim 1, further comprising;
    patterning the top electrode layer, the antiferroelectric film, and the dielectric film respectively into a top electrode, an antiferroelectric layer, and a dielectric layer; and
    forming a top electrode via over the top electrode.

3. The method of claim 1, further comprising:
    forming a bottom electrode via over the bottom electrode layer.

4. A method for fabricating an integrated circuit device, comprising:
    forming a bottom electrode over a substrate;
    forming a dielectric layer over the bottom electrode;
    forming an antiferroelectric layer over the dielectric layer, wherein the antiferroelectric layer comprises hafnium zirconium oxide, and a ratio of a zirconium content to a sum of the zirconium content and a hafnium content in the hafnium zirconium oxide is greater than 50% and less than 100%; and
    forming a top electrode over the antiferroelectric layer, wherein the bottom electrode, the dielectric layer, the antiferroelectric layer, and the top electrode collectively form a memory device.

5. The method of claim 4, wherein a thickness of the antiferroelectric layer is greater than a thickness of the dielectric layer.

6. The method of claim 5, wherein the thickness of the antiferroelectric layer is greater than about five times the thickness of the dielectric layer.

7. The method of claim 4, wherein the antiferroelectric layer has a dielectric constant greater than a dielectric constant of the dielectric layer.

8. The method of claim 4, wherein the bottom electrode and the top electrode are made of a same conductive material.

9. The method of claim 4, further comprising:
    forming a top electrode via on a top surface of the top electrode of the memory device.

10. The method of claim 4, further comprising:
    forming a bottom electrode via on a top surface of the bottom electrode of the memory device.

11. The method of claim 4, wherein a fraction of a tetragonal phase in the antiferroelectric layer is in a range from about 20% to about 100%.

12. The method of claim 4, wherein a fraction of an orthorhombic phase in the antiferroelectric layer is in a range from about 0% to about 80%.

13. A method for fabricating an integrated circuit device, comprising:
    forming an interconnect layer over a substrate, wherein the interconnect layer comprises a conductive feature; and
    forming a memory device over the conductive feature of the interconnect layer, wherein the memory device comprises:
        a bottom electrode;
        a dielectric layer over the bottom electrode;
        an antiferroelectric layer over the dielectric layer, wherein the antiferroelectric layer has a thickness greater than a thickness of the dielectric layer, wherein a fraction of a tetragonal phase in the antiferroelectric layer is in a range from about 20% to about 100%; and
        a top electrode over the antiferroelectric layer.

14. The method of claim 13, wherein a top surface of the dielectric layer is in contact with the antiferroelectric layer, and a bottom surface of the dielectric layer is in contact with the bottom electrode.

15. The method of claim 13, wherein a top surface of the antiferroelectric layer is in contact with the top electrode, and a bottom surface of the antiferroelectric layer is in contact with the dielectric layer.

16. The method of claim 13, wherein a fraction of an orthorhombic phase in the antiferroelectric layer is in a range from about 0% to about 80%.

17. The method of claim 13, wherein the dielectric layer is a metal oxide layer.

18. The method of claim 13, wherein a thickness of the top electrode is greater than a thickness of the bottom electrode.

19. The method of claim 13, further comprising:

forming a bottom electrode via over the conductive feature of the interconnect layer, such that after forming the memory device, the bottom electrode via is between the conductive feature of the interconnect layer and the bottom electrode.

20. The method of claim 13, wherein the antiferroelectric layer comprises hafnium zirconium oxide, and a ratio of a zirconium content to a sum of the zirconium content and a hafnium content in the hafnium zirconium oxide is greater than 50% and less than 100%.

\* \* \* \* \*